US012586501B2

(12) United States Patent
Johsaka et al.

(10) Patent No.: US 12,586,501 B2
(45) Date of Patent: Mar. 24, 2026

(54) DISPLAY DEVICE, DISPLAY METHOD, AND STORAGE MEDIUM

(71) Applicant: TOKYO ELECTRON LIMITED, Tokyo (JP)

(72) Inventors: Megumi Johsaka, Koshi (JP); Hiroshi Tomita, Koshi (JP); Takuya Mori, Tokyo (JP); Hideki Uchigaki, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 718 days.

(21) Appl. No.: 17/553,271

(22) Filed: Dec. 16, 2021

(65) Prior Publication Data

US 2022/0198981 A1 Jun. 23, 2022

(30) Foreign Application Priority Data

Dec. 18, 2020 (JP) ................................. 2020-210614

(51) Int. Cl.
*G09G 3/20* (2006.01)
*C23C 16/52* (2006.01)
*G09G 3/00* (2006.01)

(52) U.S. Cl.
CPC ............... *G09G 3/20* (2013.01); *C23C 16/52* (2013.01); *G09G 3/006* (2013.01)

(58) Field of Classification Search
CPC .......... G09G 3/20; G09G 3/006; C23C 16/52; H04N 7/181; H04N 5/2624; H01L 21/67276; H01L 21/67288; G06F 3/14
See application file for complete search history.

(56) References Cited

U.S. PATENT DOCUMENTS 5,245,671 A * 9/1993 Kobayashi ....... G01N 21/95684
356/418
2015/0039116 A1 * 2/2015 Yamamoto .......... H01L 21/6719
700/108

(Continued)

FOREIGN PATENT DOCUMENTS

JP       H6-232254 A     8/1994
JP       2008070238 A *   3/2008

(Continued)

*Primary Examiner* — Vu Le
*Assistant Examiner* — Zaid Muhammad Saleh
(74) *Attorney, Agent, or Firm* — Nath, Goldberg & Meyer; Jerald L. Meyer; Tanya E. Harkins

(57) ABSTRACT

A display device for displaying information about substrate processing executed in a substrate processing apparatus, includes: a display control part configured to, in response to a first instruction from a user, allow the display screen to display a first image based on first capturing data obtained by capturing an image of a display target substrate among the substrates in the substrate processing apparatus, and configured to, in response to a second instruction from the user, allow the display screen to display a second image based on second capturing data obtained by capturing the image of the display target substrate in the substrate processing apparatus, wherein the first capturing data is obtained by capturing the image of the display target substrate at a different timing from the second capturing data, or by capturing the image of the display target substrate in a different capturing region from the second capturing data.

9 Claims, 14 Drawing Sheets

(56)                    References Cited

U.S. PATENT DOCUMENTS

| | | | | |
|---|---|---|---|---|
| 2017/0287750 A1 * | 10/2017 | Amano | ............ | H01L 21/67253 |
| 2018/0253007 A1 * | 9/2018 | Kodama | .......... | H01L 21/02115 |
| 2020/0043763 A1 * | 2/2020 | Yoneda | ............ | H01L 21/67742 |

FOREIGN PATENT DOCUMENTS

| | | | | |
|---|---|---|---|---|
| JP | 2011-138930 A | | 7/2011 | |
| JP | 2012-145427 A | | 8/2012 | |
| JP | 2014135362 A | * 7/2014 | |
| JP | 2017183496 A | * 10/2017 | ....... H01L 21/67028 |
| JP | 2020-144102 A | | 9/2020 | |
| TW | 201802918 A | | 1/2018 | |
| TW | 202040712 A | | 11/2020 | |

* cited by examiner

FIG. 8

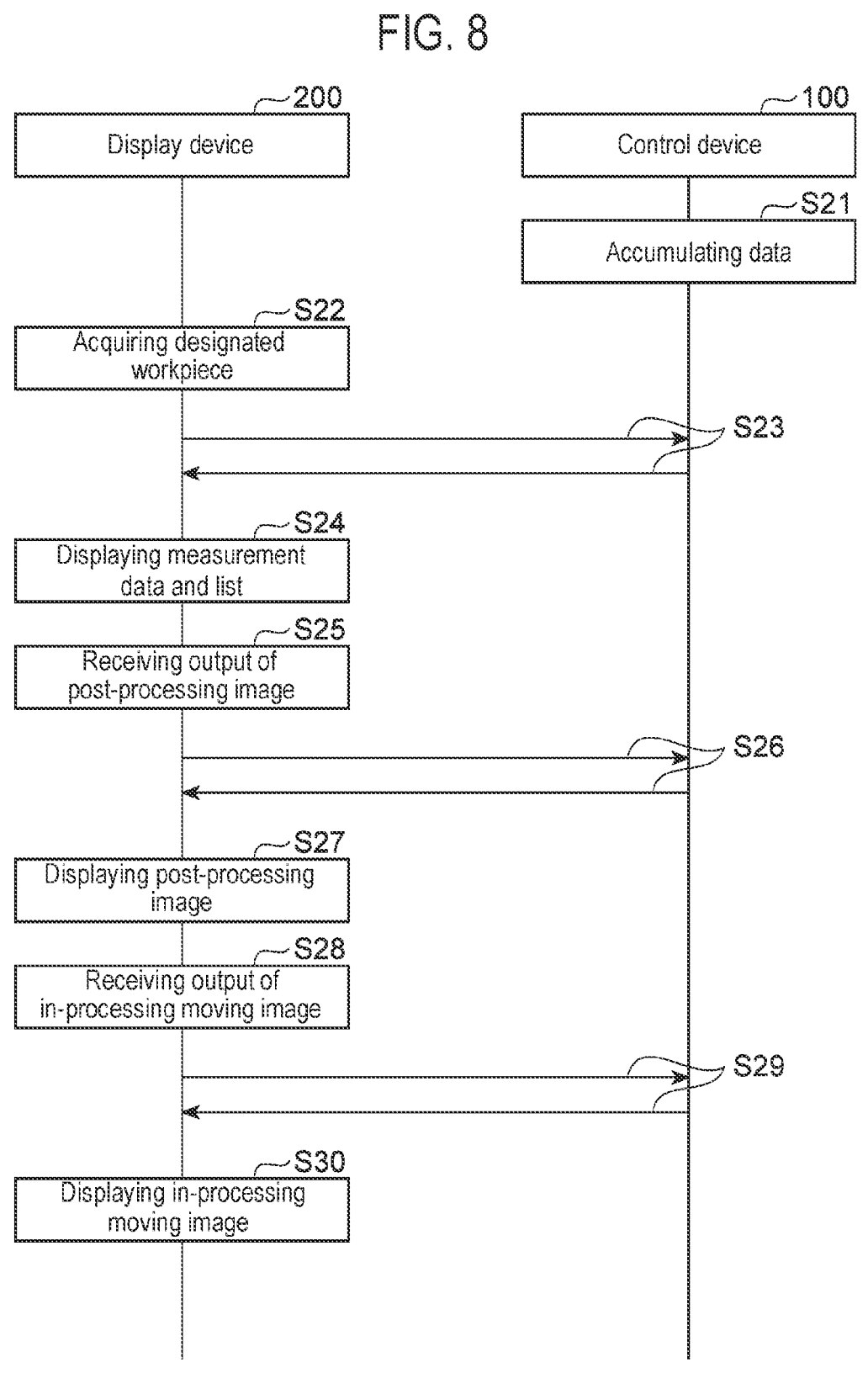

~200
Display device

~100
Control device

~S21
Accumulating data

~S22
Acquiring designated
workpiece

S23

~S24
Displaying measurement
data and list

~S25
Receiving output of
post-processing image

S26

~S27
Displaying post-processing
image

~S28
Receiving output of
in-processing moving image

S29

~S30
Displaying in-processing
moving image

| Presence or absence of abnormality | Two locations |
|---|---|
| ... | |
| ... | |
| Expected cutting position | Displayed |
| ... | |
| ... | |

FIG. 13

| WaferID | After completion of process 1 | Process 2 | Process 2 (different range) | After completion of process 2 | Process 3 | Process 3 (different range) | After completion of process 3 |
|---------|------|------|------|------|------|------|------|
| 010 | Link | Link | Link | Link | Link | Link | Link |
| 011 | Link | Link | Link | Link | Link | Link | Link |
| *** | Link | Link | Link | Link | Link | Link | Link |

DISPLAY DEVICE, DISPLAY METHOD, AND STORAGE MEDIUM

CROSS-REFERENCE TO RELATED APPLICATION

This application is based upon and claims the benefit of priority from Japanese Patent Application No. 2020-210614, filed on Dec. 18, 2020, the entire contents of which are incorporated herein by reference.

TECHNICAL FIELD

The present disclosure relates to a display device, a display method, and a non-transitory computer-readable storage medium.

BACKGROUND

Patent Document 1 disclosed a semiconductor manufacturing apparatus that includes a display means for displaying a graph relating to process data indicating a processing state in a substrate processing part for processing a substrate, and a display control means for controlling the display on the display means.

PRIOR ART DOCUMENT

Patent Document

Patent Document 1: Japanese Laid-Open Patent Publication No. 2014-135362

SUMMARY

According to one embodiment of the present disclosure, a display device for displaying, on a display screen, information about a predetermined substrate processing executed in a substrate processing apparatus that executes the predetermined substrate processing on a plurality of substrates, includes: a display control part configured to, in response to a first instruction from a user, allow the display screen to display a first image based on first capturing data obtained by capturing an image of a display target substrate among the plurality of substrates in the substrate processing apparatus, and configured to, in response to a second instruction from the user, allow the display screen to display a second image based on second capturing data obtained by capturing the image of the display target substrate in the substrate processing apparatus, wherein the first capturing data is data obtained by capturing the image of the display target substrate at a different timing from the second capturing data, or data obtained by capturing the image of the display target substrate in a different capturing region from the second capturing data.

BRIEF DESCRIPTION OF DRAWINGS

The accompanying drawings, which are incorporated in and constitute a portion of the specification, illustrate embodiments of the present disclosure, and together with the general description given above and the detailed description of the embodiments given below, serve to explain the principles of the present disclosure.

FIG. 8 is a sequence diagram showing an example of a processing procedure in the control device and the display device.

FIG. 13 is a schematic diagram showing an example of display of a list.

DETAILED DESCRIPTION

Figure 1:
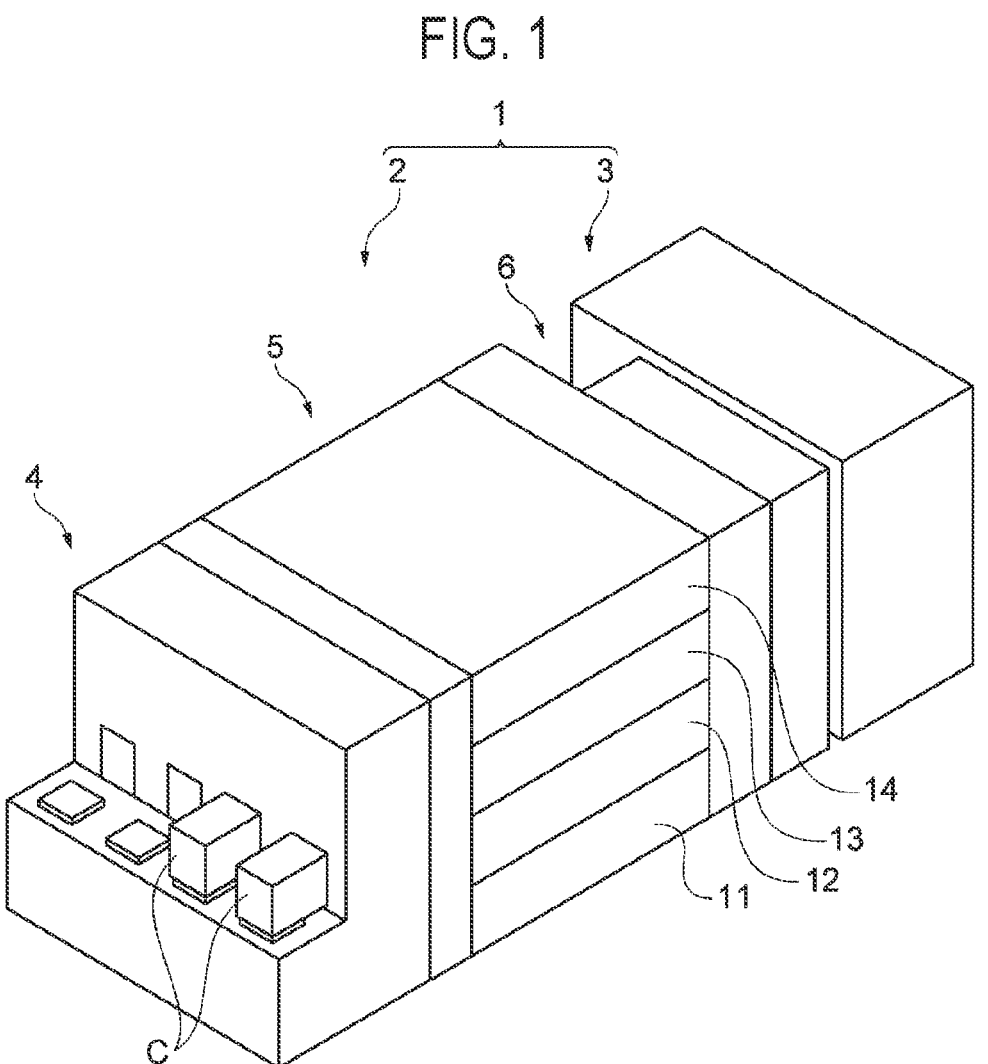
FIG. 1 is a schematic diagram showing an example of a substrate processing system.

Reference will now be made in detail to various exemplary embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

A display device according to one exemplary embodiment is a device for displaying, on a display screen, information about a predetermined substrate processing executed in a substrate processing apparatus that executes the predetermined substrate processing on a plurality of substrates. The display device includes a display control part configured to, in response to a first instruction from a user, allow the display screen to display a first image based on first capturing data obtained by capturing an image of a display target substrate among the plurality of substrates in the substrate processing apparatus, and configured to, in response to a second instruction from the user, allow the display screen to display a second image based on second capturing data obtained by capturing the image of the display target substrate in the substrate processing apparatus. The first capturing data is data obtained by capturing an image of the display target substrate at a different timing from the second capturing data, or data obtained by capturing the image of the display target substrate over a different capturing region from the second capturing data.

In this display device, the user can confirm two types of images having different imaging timings or different capturing regions from each other for one display target substrate. Therefore, it is not necessary to individually confirm the two types of images in different devices, and it is possible to easily understand the state of the substrate processing executed previously for the display target substrate.

The display control part may be configured to allow the display screen to display measurement data relating to the substrate processing when the first capturing data or the second capturing data, which is data already obtained for the display target substrate, is acquired by a sensor provided in the substrate processing apparatus. In this case, the data indicating a measurement value acquired by the sensor and the captured image of the substrate for which the data is displayed can be displayed on the display screen. Therefore, the processing result or the processing situation that cannot be confirmed only from the sensor data can be confirmed by one display device. Accordingly, it is possible to simplify the work for understanding the state of the substrate processing executed previously.

The first capturing data may be still image data obtained by capturing an image of the entire front surface of the display target substrate after the substrate processing. The second capturing data may be still image data obtained by capturing an image of a peripheral edge region of the front surface of the display target substrate after the substrate processing. The display control part may be configured to allow the display screen to simultaneously display a first still image based on the first capturing data and a second still image based on the second capturing data. In this case, the user can confirm the processing result of the entire front surface of the substrate and the processing result of the peripheral edge region of the front surface of the substrate in one display screen. As a result, it is possible to shorten the time required to understand the processing result of the entire front surface and the peripheral edge region.

The display control part may be configured to, based on the second capturing data, allow the display screen to display the second still image so that a circumferential direction position of the display target substrate is indicated on a horizontal axis and a radial direction position of the display target substrate is indicated on a vertical axis. In this case, it is possible to reduce an area for displaying the still image of the peripheral edge region on the display screen.

The display control part may be configured to allow the display screen to further display an auxiliary image indicating information different from the first capturing data and the second capturing data so that the auxiliary image is arranged side by side in the horizontal direction with respect to the first still image. The display control part may be configured to allow the display screen to display the second still image so that the second still image is arranged side by side in the vertical direction with respect to both the first still image and the auxiliary image. In this case, it is possible to effectively utilize a space generated by simultaneously displaying the image of the entire front surface and the image of the peripheral edge region on the display screen.

The display control part may be configured to execute an enlarged display control for enlarging and displaying a portion of the first still image or the second still image. The display control part may be configured to allow the display screen to display a guide image indicating an enlarged position with respect to the entirety of the partially enlarged/displayed still image at least during a period in which the enlarged display control is being executed. In this case, the user can easily understand which portion is enlarged.

The display control part may be configured to superimpose an image indicating an expected cutting position of the display target substrate on the first still image. In this case, it is possible to estimate the influence of the result of the substrate processing on each chip obtained by cutting and segmenting the display target substrate.

The first capturing data may be moving image data obtained by capturing an image of the display target substrate or the surrounding of the display target substrate during execution of the substrate processing on the display target substrate. The second capturing data may be still image data obtained by capturing an image of at least a portion of the front surface of the display target substrate after the substrate processing. In this case, in one display device, the processing situation can be confirmed by a moving image and the processing result can be confirmed by a still image for one substrate. As a result, it becomes easier to understand the processing state.

The first capturing data may be moving image data obtained by capturing an image of the display target substrate or the surrounding of the display target substrate during execution of the substrate processing on the display target substrate. The display control part may be configured to simultaneously display side by side, on the display screen, a moving image based on the moving image data and an additional moving image corresponding to the moving image on a substrate different from the display target substrate. In this case, it is possible to confirm the processing situation while comparing two different substrates.

The display control part may be configured to allow the display screen to display the moving image and the additional moving image based on an instruction from the user indicating an arrangement order of the moving image and the additional moving image. In this case, the user can confirm the moving image by understanding the correspondence between the two moving images and the individual substrate.

The display control part may be configured to, upon receiving a playback start instruction from the user, start a playback of the moving image and a playback of the additional moving image in a simultaneous manner. The display control part may be configured to, upon receiving a playback stop instruction from the user, stop the playback of the moving image and the playback of the additional moving image in a simultaneous manner. In this case, it is possible to simplify the user's instruction when confirming the two moving images.

The display control part may be configured to allow the display screen to display the moving image and the additional moving image so that execution timings of the substrate processing in the displayed moving images and the displayed additional moving image coincide with each other. In this case, it becomes easy to understand the processing situation by comparing the moving images.

The display control part may be configured to allow the display screen to display the moving images based on the moving image data so that the entire front surface of the display target substrate is not displayed and a region between the center and a portion of the peripheral edge of the front surface of the display target substrate is displayed. In this case, the state of the front surface of the substrate in the moving images can be confirmed at high resolution.

The display control part may be configured to allow the display screen to display a list of information specifying a plurality of candidate substrates designated by the user and capable of becoming the display target substrate. The display control part may be configured to allow the display device to hold inspection information indicating the presence or absence of a processing abnormality for the plurality of candidate substrates included in the list and configured to, when the inspection information indicates an abnormality, allow the list to display information indicating that an abnormality has occurred in the substrate processing for the candidate substrate for which the abnormality is indicated by the inspection information. In this case, the user can immediately understand the substrate on which the abnormality has occurred by checking the list. As a result, it is possible to simplify the work of understanding the state of the substrate processing for the substrate in which the abnormality has occurred.

A display method according to one exemplary embodiment is a method of displaying, on a display screen, information about a predetermined substrate processing executed in a substrate processing apparatus that executes the predetermined substrate processing on a plurality of substrates. The display method includes: allowing the display screen to, in response to a first instruction from a user, display a first image based on first capturing data obtained previously by capturing an image of a display target substrate among the plurality of substrates in the substrate processing apparatus; and allowing the display screen to, in response to a second instruction from the user, display a second image based on second capturing data obtained previously by capturing the image of the display target substrate in the substrate processing apparatus. The first capturing data is data obtained by capturing the image of the display target substrate at a different timing from the second capturing data, or data obtained by capturing the image of the display target substrate over a different capturing region from the second capturing data. In this display method, as in the display device described above, it is possible to easily understand the state of the substrate processing executed previously for the display target substrate.

A non-transitory computer-readable storage medium according to one exemplary embodiment is a computer-readable storage medium that stores a program for causing a display device to execute the above-described display method.

Hereinafter, one embodiment will be described with reference to the drawings. In the description, the same elements or elements having the same function will be designated by like reference numerals, and the duplicate description thereof will be omitted.

[Substrate Processing System]

A substrate processing system 1 shown in FIG. 1 is a system that forms a photosensitive film on a workpiece W, exposes the photosensitive film, and develops the photosensitive film. The workpiece W to be processed is, for example, a substrate, or a substrate in which a film, a circuit or the like is formed by being subjected to predetermined processing. The substrate is, for example, a silicon wafer. The workpiece W (substrate) may be circular. The workpiece W may be a glass substrate, a mask substrate, an FPD (Flat Panel Display), or the like. The photosensitive film is, for example, a resist film.

Figure 2:
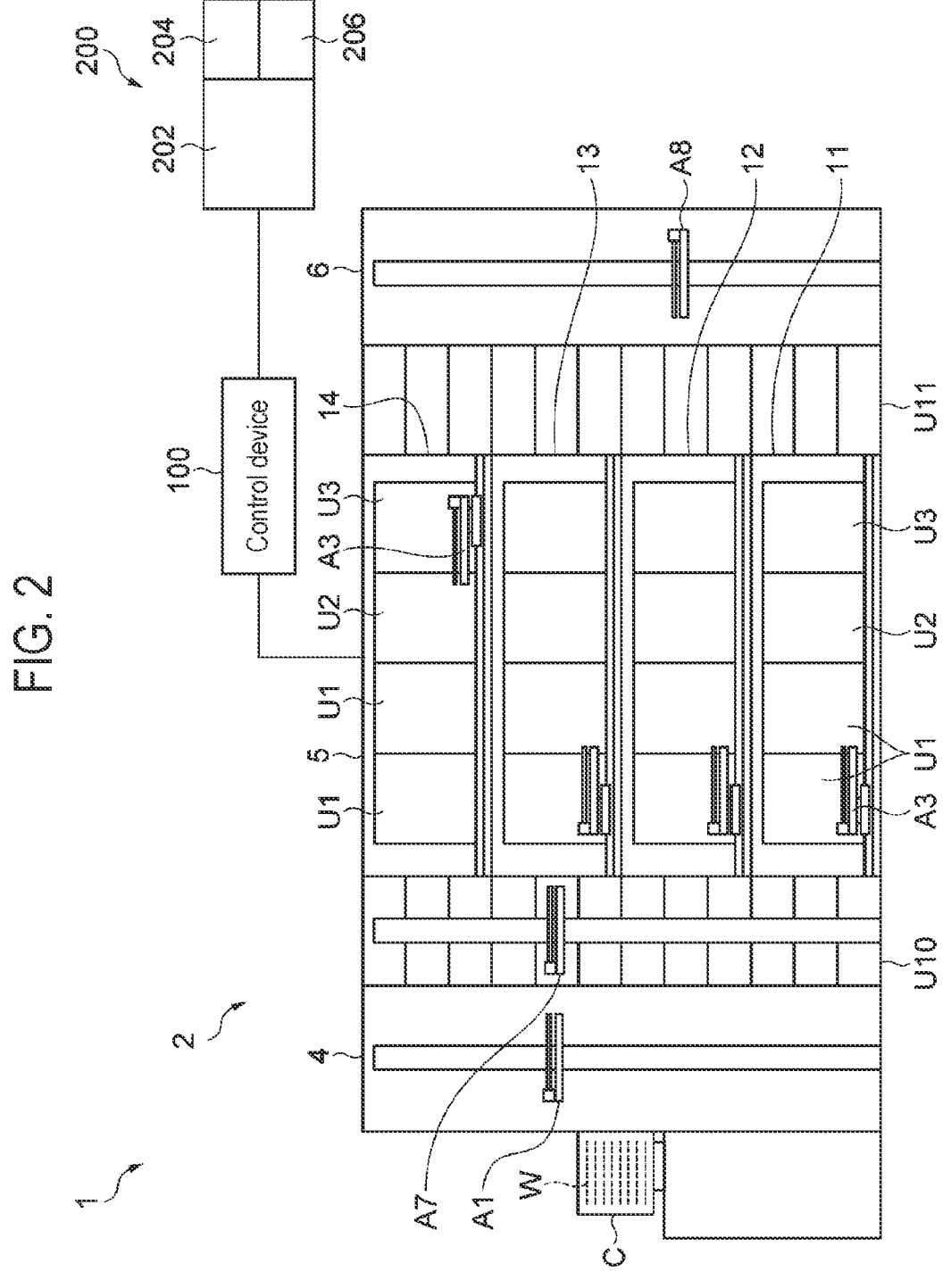
FIG. 2 is a schematic diagram showing an example of a coating/developing apparatus.

As shown in FIGS. 1 and 2, the substrate processing system 1 includes a coating/developing apparatus 2 (substrate processing apparatus), an exposure apparatus 3, a control device 100, and a display device 200. In the substrate processing system 1, information about the processing in the coating/developing apparatus 2 is displayed to a user (for example, a worker or the like) by the display device 200. In the following, first, the processing in the coating/developing apparatus 2 will be described.

The coating/developing apparatus 2 performs a process of coating a resist (chemical liquid) on the front surface of the workpiece W to form a resist film before an exposure process performed by the exposure apparatus 3, and performs a process of developing the resist film after the exposure process. The exposure apparatus 3 is an apparatus for exposing the resist film (photosensitive film) formed on the workpiece W (substrate). Specifically, the exposure apparatus 3 irradiates an exposure target portion of the resist film with energy rays by a method such as immersion exposure or the like. The coating/developing apparatus 2 includes a carrier block 4, a processing block 5, and an interface block 6.

The carrier block 4 loads the workpiece W into the coating/developing apparatus 2 and unloads the workpiece W from the coating/developing apparatus 2. For example, the carrier block 4 can support a plurality of carriers C for the workpiece W, and incorporates a transfer device A1 including a delivery arm. The carrier C accommodates, for example, a plurality of circular workpieces W. The transfer device A1 takes out the workpiece W from the carrier C, delivers the same to the processing block 5, receives the workpiece W from the processing block 5, and returns the same to the carrier C. The processing block 5 includes processing modules 11, 12, 13 and 14.

The processing module 11 includes a liquid processing unit U1, a heat treatment unit U2, and a transfer device A3 for transferring the workpiece W to these units. The treatment module 11 forms a lower layer film on the front surface of the workpiece W by the liquid processing unit U1 and the heat treatment unit U2. The liquid processing unit U1 coats a processing liquid for formation of the lower layer film on the workpiece W. The heat treatment unit U2 performs various heat treatments involved in the formation of the lower layer film.

The processing module 12 incorporates a liquid processing unit U1, a heat treatment unit U2, and a transfer device A3 for transferring the workpiece W to these units. The processing module 12 forms a resist film on the lower layer film by the liquid processing unit U1 and the heat treatment unit U2. The liquid processing unit U1 coats a processing liquid for formation of the resist film on the lower layer film. The heat treatment unit U2 performs various heat treatments involved in the formation of the resist film.

The processing module 13 incorporates a liquid processing unit U1, a heat treatment unit U2, and a transfer device A3 for transferring the workpiece W to these units. The treatment module 13 forms an upper layer film on the resist film by the liquid processing unit U1 and the heat treatment unit U2. The liquid processing unit U1 coats a processing liquid for formation of the upper layer film on the resist film. The heat treatment unit U2 performs various heat treatments involved in the formation of the upper layer film.

The processing module 14 incorporates a liquid processing unit U1, a heat treatment unit U2, and a transfer device A3 for transferring the workpiece W to these units. The processing module 14 uses the liquid processing unit U1 and the heat treatment unit U2 to perform a developing process on the exposed resist film and perform a heat treatment involved in the developing process. The liquid processing unit U1 performs the developing process for the resist film by coating a developing liquid on the front surface of the exposed workpiece W and then rinsing the workpiece W with a rinsing liquid. The heat treatment unit U2 performs various heat treatments involved in the development process. Specific examples of the heat treatment include heat treatment before development (PEB: Post Exposure Bake), heat treatment after development (PB: Post Bake), and the like.

A shelf unit U10 is provided on the side of the carrier block 4 inside the processing block 5. The shelf unit U10 is divided into a plurality of cells arranged in the vertical direction. A transfer device A7 including an elevating arm is provided in the vicinity of the shelf unit U10. The transfer device A7 raises and lowers the workpiece W between the cells of the shelf unit U10.

A shelf unit U11 is provided on the side of the interface block 6 inside the processing block 5. The shelf unit U11 is divided into a plurality of cells arranged in the vertical direction.

The interface block 6 delivers the workpiece W to and from the exposure apparatus 3. For example, the interface block 6 is provided with a built-in transfer device A8 including a delivery arm and is connected to the exposure apparatus 3. The transfer device A8 delivers the workpiece W arranged on the shelf unit U11 to the exposure apparatus 3. The transfer device A8 receives the workpiece W from the exposure apparatus 3 and returns the same to the shelf unit U11.

(Liquid Processing Unit)

Figure 3:
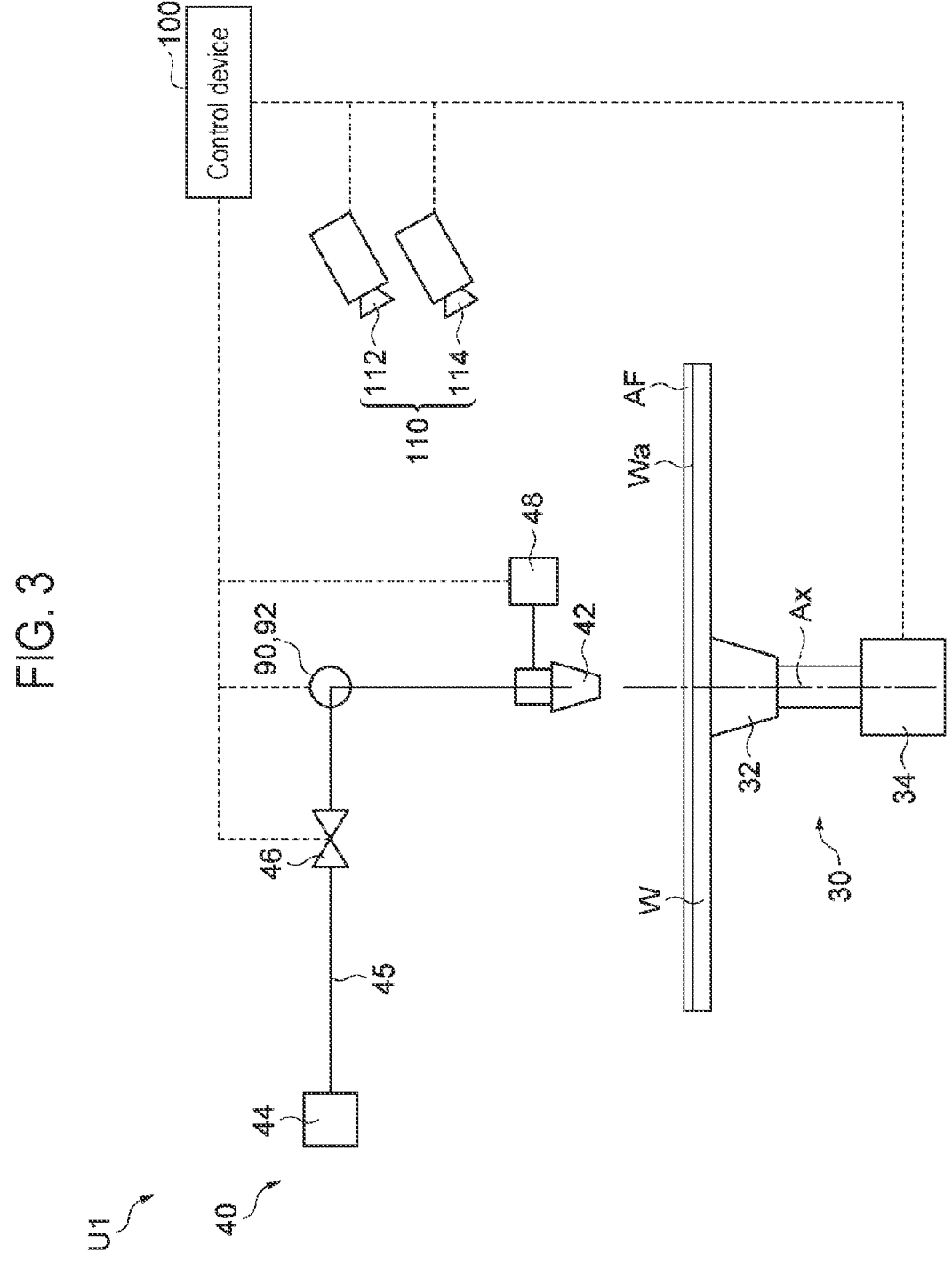
FIG. 3 is a schematic diagram showing an example of a liquid processing unit and a capturing part.

Next, an example of the liquid processing unit U1 will be described with reference to FIG. 3. The liquid processing unit U1 forms a film of a processing liquid (hereinafter referred to as "coating film AF") by applying a processing liquid to the front surface Wa of the workpiece W. As shown in FIG. 3, the liquid processing unit U1 includes a rotary holding part 30 and a processing liquid supply part 40.

The rotary holding part 30 holds and rotates the workpiece W. The rotary holding part 30 includes, for example, a holder 32 and a rotary driver 34. The holder 32 holds (supports) the workpiece W. The holder 32 supports, for example, the central portion of the workpiece W arranged horizontally with the front surface Wa thereof facing upward and holds the workpiece W by vacuum suction or the like. The rotary driver 34 is connected to the holder 32 via a shaft.

The rotary driver 34 is an actuator including a power source such as an electric motor or the like and is configured to rotate the holder 32 about a vertical axis Ax. As the holder 32 is rotated by the rotary driver 34, the workpiece W held (supported) by the holder 32 is rotated. The holder 32 may hold the workpiece W so that the center CP of the workpiece W (see FIG. 4A) substantially coincides with the axis Ax.

The processing liquid supply part 40 supplies a processing liquid to the front surface Wa of the workpiece W. The processing liquid is a solution (e.g., a resist) for forming a film such as a resist film or the like. The processing liquid supply part 40 includes, for example, a nozzle 42, a source 44, an opening/closing valve 46, and a nozzle driver 48. The nozzle 42 discharges the processing liquid onto the front surface Wa of the workpiece W held by the holder 32. For example, the nozzle 42 is arranged above the workpiece W (vertically above the center CP of the workpiece W) to discharge the processing liquid downward. The source 44 supplies the processing liquid to the nozzle 42.

The opening/closing valve 46 is provided in a supply path 45 between the nozzle 42 and the source 44. The opening/closing valve 46 switches the opened/closed state of the supply path 45. The nozzle driver 48 moves the nozzle 42 between a discharge position above the workpiece W and a standby position spaced apart from the discharge position. The discharge position is, for example, a position vertically above the rotational center of the workpiece W (a position on the axis Ax). The standby position is set, for example, to a position outside the peripheral edge of the workpiece W. The nozzle driver 48 may move the nozzle 42 in the vertical direction (the direction perpendicular to the front surface Wa) and may move the nozzle 42 in the horizontal direction (the direction extending along the front surface Wa).

(Measurement Part)

The coating/developing apparatus 2 may include a measurement part 90 that measures data indicating a processing state on the workpiece W during execution of processing (e.g., liquid processing or the like) on the workpiece W. The data indicating the processing state is data of a physical quantity that affects the processing result (e.g., the film thickness, etc.) for the workpiece W. The measurement part 90 includes at least one sensor that measures the data indicating the processing state. The measurement part 90 may be provided in the liquid processing unit U1. The measurement part 90 includes, for example, a temperature sensor 92 that measures a temperature of the processing liquid discharged from the nozzle 42. The temperature sensor 92 may be provided in the supply path 45.

The data to be measured by the measurement part 90 is not limited to the temperature of the processing liquid. The measurement part 90 may include a sensor that measures a flow rate (flow rate per unit time or total flow rate) of the processing liquid discharged from the nozzle 42. The measurement part 90 may include a sensor that measures an internal temperature of a housing (not shown) that defines a space in which the rotary holding part 30 and the nozzle 42 are accommodated and liquid processing is performed, or may include a sensor that measures an internal pressure of the housing. The flow rate of the processing liquid, the internal temperature of the housing, and the internal pressure of the housing also affect the processing result for the workpiece W.

(Capturing Part)

The coating/developing apparatus 2 further includes a capturing part 110 that records a processing state during the execution of the processing (e.g., liquid processing, etc.) on the workpiece W. The capturing part 110 includes, for example, cameras 112 and 114 that generate moving image data. The cameras 112 and 114 are provided inside the liquid processing unit U1 (inside the housing). The cameras 112 and 114 may perform the capturing in different capturing ranges. In other words, a region in the moving image obtained by the camera 112 is different from a region in the moving image obtained by the camera 114.

Figure 4A:
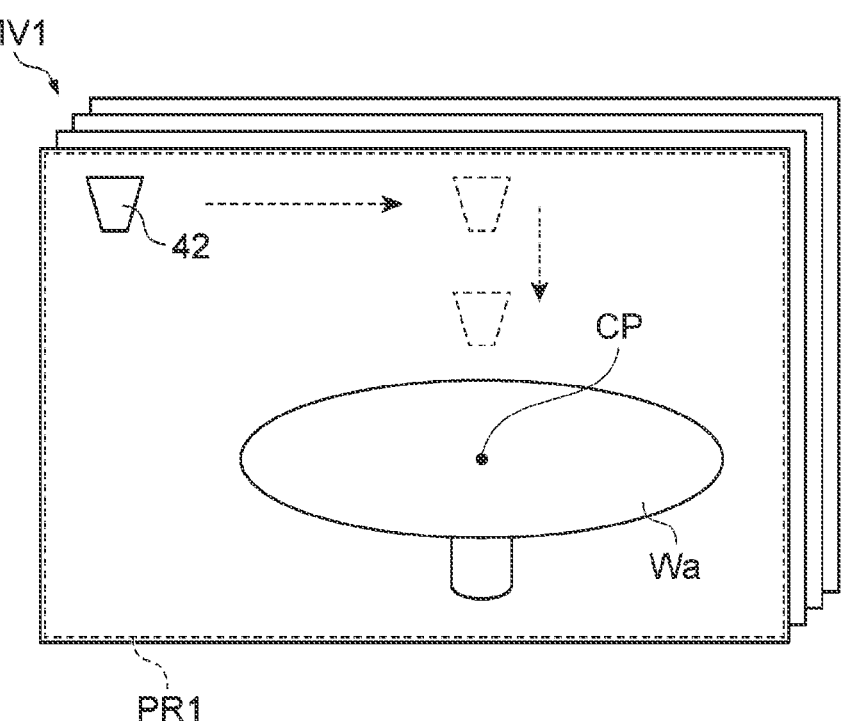
FIGS. 4A and 4B are schematic diagrams showing examples of a moving image based on capturing data.

In one example, the camera 112 can capture a capturing region PR1 including the front surface Wa of the workpiece W and the nozzle 42 during the execution of the liquid processing. FIG. 4A shows an example of a moving image MV1 obtained by the camera 112. The moving image MV shown in FIG. 4A is a moving image obtained when the capturing region PR1 of the camera 112 is set to include the entire front surface Wa of the workpiece W held by the holder 32 and the entire movement path of the nozzle 42 between the discharge position and the standby position. The camera 12 may perform the capturing with respect to the capturing region PR1 during a period in which the nozzle 42 is moved between the discharge position and the standby position, a period in which the processing liquid is discharged from the nozzle 42 at the discharge position, and a period in which a coating film AF of the processing liquid is formed by stopping the discharge of the processing liquid and then rotating the workpiece W.

Figure 4B:
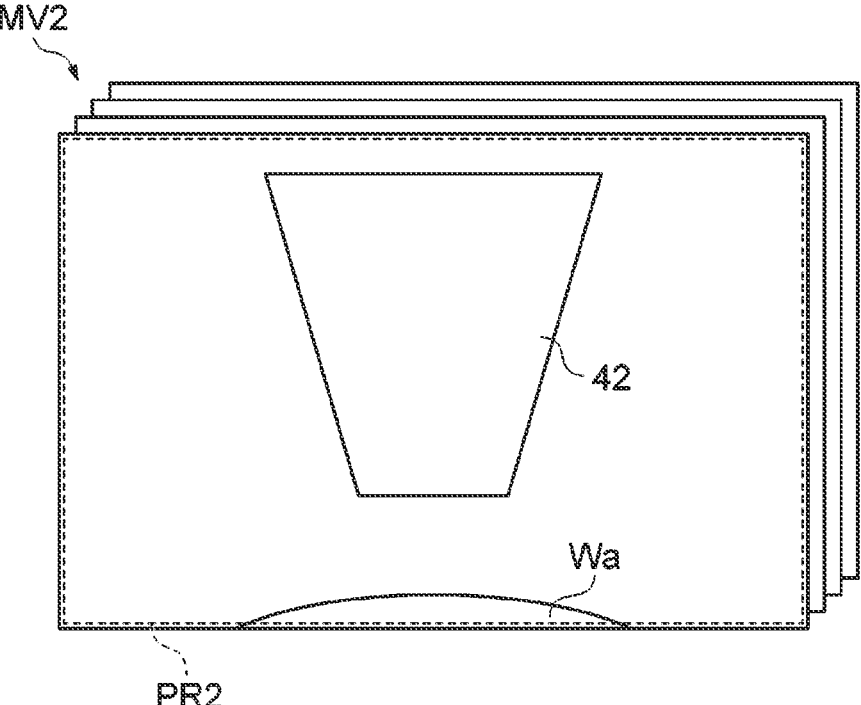

In one example, the camera 114 can perform the capturing with respect to a capturing region PR2 including the surrounding of the workpiece W during the execution of the liquid processing. The camera 114 may be arranged around the workpiece W and may capture an image of a member used for liquid processing on the workpiece W. FIG. 4B shows an example of a moving image MV2 obtained by the camera 114. The moving image MV2 shown in FIG. 4B is a moving image obtained when the capturing region PR2 of the camera 114 is set to include the entire nozzle 42 arranged above the workpiece W. As shown in FIG. 4B, the capturing region PR2 may include a portion of the workpiece W, or may not include the workpiece W. The camera 114 may perform the capturing with respect to the capturing region PR2 during a period in which the nozzle 42 discharges the processing liquid after the nozzle 42 is arranged at the discharge position. The above-mentioned capturing regions PR1 and PR2 may be fixed or may be changed according to the progress of processing or the movement of members.

Although detailed illustration is omitted, the heat treatment unit U2 includes, for example, a heating part for heating the workpiece W and a cooling part for cooling the workpiece W, which are used to heat-treat the workpiece W. The coating/developing apparatus 2 may include a measurement part (sensor) that measures data indicating the processing state during the execution of the heat treatment on the workpiece W. The measurement part may measure a temperature of the heating part that is heating the workpiece W. The coating/developing apparatus 2 may include a capturing part for recording the processing state as an image during the execution of the heat treatment on the workpiece W.

Hereinafter, each of a process of forming a predetermined film on the workpiece W and a process of processing the film formed on the workpiece W will be referred to as "substrate processing." Further, a process included in the substrate processing and executed by one unit will be referred to as "step" or "unit process." Examples of the substrate processing for forming the predetermined film on the workpiece W may include a lower layer film forming process in the processing module 11, a resist film forming process in the processing module 12, and an upper layer film forming process in the processing module 13. Each of the processes of forming the lower layer film, the resist film and the upper layer film includes a step of performing the liquid processing in the liquid processing unit U1 and a step of performing the heat treatment in the heat treatment unit U2. Examples of the substrate processing for processing the film formed on the workpiece W may include a process of forming a resist pattern. The resist pattern forming process includes a step of exposing the workpiece W, a step of developing the resist film, and a step of performing a heat treatment involved in the development.

(Inspection Unit)

Figure 5:
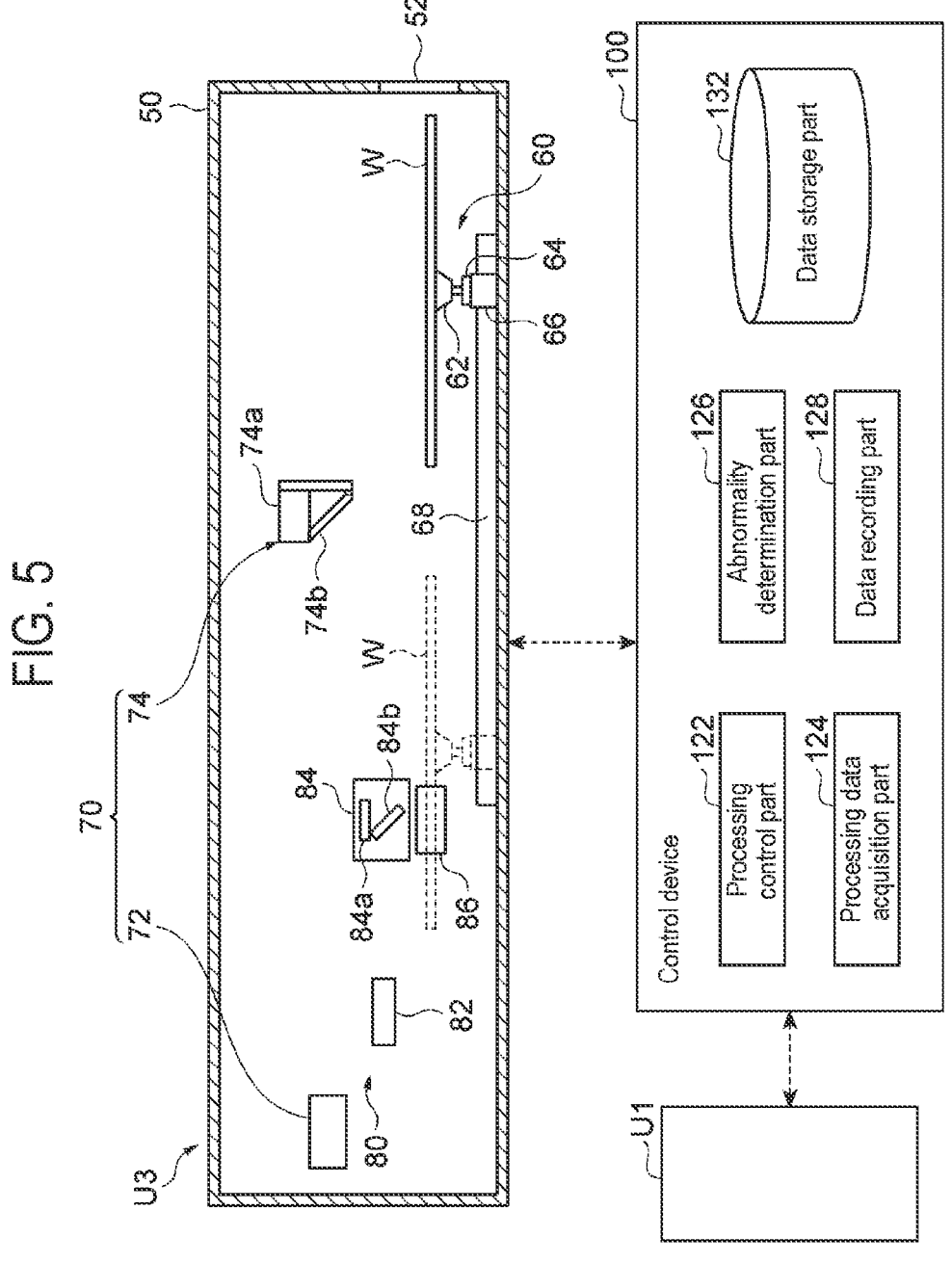
FIG. 5 is a diagram schematically showing an example of an inspection unit and an example of a functional configuration of a control device.

Each of the processing modules 11, 12, 13 and 14 may further include an inspection unit U3. After executing the substrate processing (after performing the liquid processing and the heat treatment), the inspection unit U3 captures an image of the front surface Wa of the workpiece W to inspect the processing state on the front surface Wa of the workpiece W. More specifically, the inspection unit U3 captures the image of the front surface Wa of the workpiece W after executing one substrate processing and before starting the next substrate processing. While the capturing part 110 described above generates the moving image data, the inspection unit U3 generates still image data. As shown in FIG. 5, the inspection unit U3 includes, for example, a housing 50, a rotary holding subunit 60, a surface capturing subunit 70, and a peripheral edge capturing subunit 80. These subunits are arranged inside the housing 50. A loading/unloading port 52 for loading the workpiece W into the housing 50 and unloading the workpiece W to the outside of the housing 50 is formed on one end wall of the housing 50.

The rotary holding subunit 60 includes a holding base 62, actuators 64 and 66, and a guide rail 68. The holding base 62 is, for example, a suction chuck that holds the workpiece W substantially horizontally by suction or the like.

The actuator 64 is, for example, an electric motor and is configured to rotationally drive the holding base 62. That is, the actuator 64 rotates the workpiece W held on the holding base 62. The actuator 64 may include an encoder for detecting a rotation position (rotation angle) of the holding base 62. In this case, a capturing position at which an image of each surface of the workpiece W is captured by each capturing subunit may be associated with the rotation position. When the workpiece W has a notch, a posture of the workpiece W can be specified based on the notch determined by each capturing subunit and the rotation position detected by the encoder.

The actuator 66 is, for example, a linear actuator, and is configured to move the holding base 62 along the guide rail 68. That is, the actuator 66 conveys the workpiece W held by the holding base 62 between one end side and the other end side of the guide rail 68. The guide rail 68 extends linearly (for example, in a straight line) inside the housing 50.

The surface capturing subunit 70 includes a camera 72 and an illumination module 74. The camera 72 includes a lens and one capturing element (e.g., a CCD image sensor, a CMOS image sensor, or the like). The camera 72 faces the illumination module 74.

The illumination module 74 includes a light source 74a and a half mirror 74b. The half mirror 74b is arranged inside the housing 50 in a state in which the half mirror 74b is inclined by approximately 45 degrees with respect to the horizontal direction. The half mirror 74b is located above the intermediate portion of the guide rail 68 so as to intersect the extension direction of the guide rail 68 when viewed from above. The half mirror 74b has a rectangular shape when viewed from above. A length of the half mirror 74b in a longitudinal direction (a direction intersecting the guide rail 68 and the vertical direction) is larger than a diameter of the workpiece W.

The light source 74a is located above the half mirror 74b. Light emitted from the light source 74a passes through the half mirror 74b as a whole and is irradiated downward. The light that has passed through the half mirror 74b is reflected by an object located below the half mirror 74b and is then reflected again by the half mirror 74b. The light passes through the lens of the camera 72 and is incident on the capturing element of the camera 72. That is, the camera 72 can capture an image of an object existing in the irradiation region of the light source 74a through the half mirror 74b. For example, when the holding base 62 for holding the workpiece W is moved along the guide rail 68 by the actuator 66, the camera 72 can capture an image of the front surface Wa of the workpiece W passing through the irradiation region of the light source 74a. As a result, the still image data is generated by capturing the image of the entire front surface Wa of the workpiece W. The still image data obtained by the camera 72 is transmitted to the control device 100.

The peripheral edge capturing subunit 80 includes a camera 82, an illumination module 84, and a mirror member 86. The camera 82 includes a lens and one capturing element (e.g., a CCD image sensor, a CMOS image sensor, or the like). The camera 82 faces the illumination module 84.

The illumination module is arranged above the workpiece W held by the holding base 62. The illumination module 84 includes a light source 84a and a half mirror 84b. The half mirror 84*b* is arranged to be inclined by approximately 45 degrees with respect to the horizontal direction. The mirror member 86 is arranged below the illumination module 84. The mirror member 86 includes, for example, a main body made of an aluminum block and a reflective surface.

The reflective surface of the mirror member 86 faces an end surface and a peripheral edge region of the back surface of the workpiece W held by the holding base 62 when the workpiece W held by the holding base 62 is located at the end of the guide rail 68 farther from the loading/unloading port 52. The reflective surface of the mirror member 86 is inclined with respect to the rotation axis of the holding base 62. The reflective surface of the mirror member 86 may be a curved surface recessed in a direction away from the end surface of the workpiece W held by the holding base 62.

In the illumination module 84, light emitted from the light source 84*a* passes through the half mirror 84*b* as a whole and is irradiated downward. The light that has passed through the half mirror 84*b* is reflected by the reflective surface of the mirror member 86 located below the half mirror 84*b*. When the workpiece W held by the holding base 62 is located at the end of the guide rail 68 far from the loading/unloading port 52, the reflected light that has passed through the half mirror 84*b* and has been reflected by the reflective surface of the mirror member 86 is mainly irradiated on the end surface and the peripheral edge region of the front surface Wa of the workpiece W.

The reflected light reflected from the peripheral edge region of the front surface Wa of the workpiece W is directly incident on the half mirror 84*b* without traveling toward the reflective surface of the mirror member 86. Thereafter, the reflected light is incident on the capturing element of the camera 82. On the other hand, the reflected light reflected from the end surface of the workpiece W travels toward the reflective surface of the mirror member 86. This reflected light is sequentially reflected by the reflective surface of the mirror member 86 and the half mirror 84*b* and is incident on the capturing element of the camera 82. As described above, the reflected light from the peripheral edge region of the front surface Wa of the workpiece W and the reflected light from the end surface of the workpiece W are incident on the capturing element of the camera 82 through different optical paths.

As described above, both the reflected light from the peripheral edge region of the front surface Wa of the workpiece W and the reflected light from the end surface of the workpiece W are incident on the capturing element of the camera 82. That is, the camera 82 is configured to capture both images of the peripheral edge region of the front surface Wa of the workpiece W and the end surface of the workpiece W to generate still image data of the peripheral edge region of the front surface Wa and the end surface of the workpiece W. The camera 82 may generate still image data in a state in which the peripheral edge region of the front surface Wa and the end surface of the workpiece W are connected to each other. The still image data obtained by the camera 82 is transmitted to the control device 100.

(Control Device)

The control device 100 controls the coating/developing apparatus 2. The control device 100 controls the coating/developing apparatus 2 so that a plurality of substrate processing is performed on each of the plurality of workpieces W. As shown in FIG. 5, the control device 100 includes, as functional configurations (hereinafter referred to as "functional modules"), for example, a processing control part 122, a processing data acquisition part 124, an abnormality determination part 126, a data recording part 128, and a data storage part 132. Processing executed by these functional modules corresponds to the processing executed by the control device 100.

The processing control part 122 controls the coating/developing apparatus 2 so that the plurality of substrate processing is performed on each workpiece W. The processing control part 122 controls each unit of the coating/developing apparatus 2 according to processing information in which the processing conditions such as the workpiece W to be processed, the processing unit used for the substrate processing, the execution timing of the substrate processing, and the like are defined. The processing data acquisition part 124 acquires measurement data from the sensor of the measurement part 90 and acquires moving image data from the capturing part 110 (cameras 112 and 114) while the substrate processing is being executed for each workpiece W. Further, the processing data acquisition part 124 acquires still image data from each of the plurality of inspection units U3 for each workpiece W. The abnormality determination part 126 determines the presence or absence of an abnormality in each of the plurality of substrate processing for each workpiece W based on various pieces of data acquired by the processing data acquisition part 124.

For each workpiece W, the data recording part 128 associates individual information (e.g., identification number) capable of specifying (identifying) an individual of the workpiece W and image data (moving image data and still image data) obtained for each substrate processing with each other and then records the associated data in the data storage part 132. The data recording part 128 may associate the image data acquired by the processing data acquisition part 124 with each workpiece W based on the processing information when the substrate processing is executed by the processing control part 122. For each workpiece W, the data recording part 128 may further associate at least one piece of information selected from the date and time at which the substrate processing is executed, the individual information of the processing unit that has executed the substrate processing, the information indicating the project (lot), and the measurement data obtained from the measurement part 90 with the individual information of the workpiece W. and may record the associated information in the data storage part 132.

For each of the plurality of workpieces W, the data storage part 132 stores the individual information of the workpiece W and the image data and the like associated with the individual information. The data storage part 132 may transmit the requested image data or the like to the display device 200 in response to a request for data transmission from the display device 200, which will be described later in detail.

The specific configuration of the substrate processing apparatus is not limited to the configuration of the coating/developing apparatus 2 illustrated above. The substrate processing apparatus may be any apparatus as long as it includes a processing part for performing predetermined substrate processing on a workpiece W, a measurement part for acquiring image data during or after the substrate processing on the workpiece W, and a control part capable of controlling the processing part and the measurement part.

(Substrate Processing Method)

Figure 6:
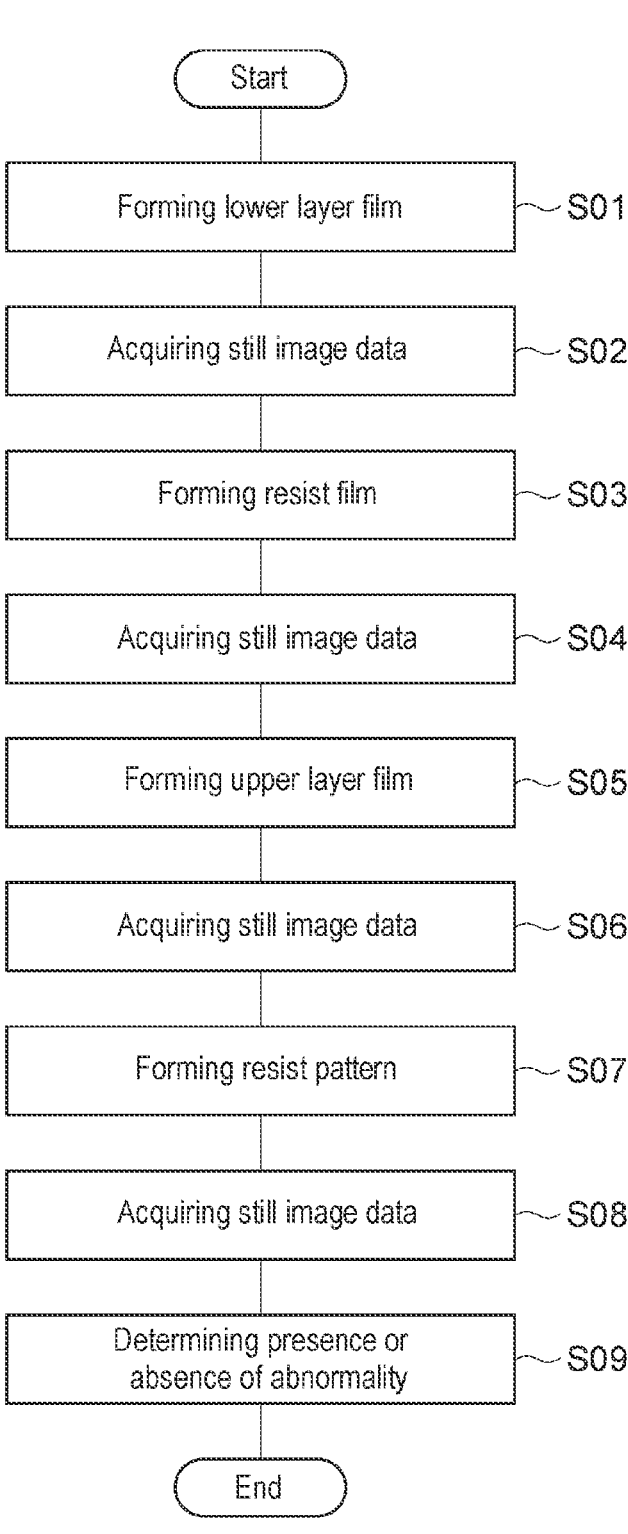
FIG. 6 is a flowchart showing an example of a substrate processing method.

Next, with reference to FIG. 6, a coating/developing process executed in the coating/developing apparatus 2 will be described as an example of a substrate processing method. FIG. 6 is a flowchart showing a procedure of processes executed sequentially for one workpiece W. First, the control device 100 controls the transfer device A1 so as to transfer the workpiece W in the carrier C to the shelf unit U10 and controls the transfer device A7 so as to arrange the workpiece W in the cell for the processing module 11.

Subsequently, the control device 100 controls the coating/developing apparatus 2 so as to execute the substrate processing for forming a lower layer film on the front surface Wa of the workpiece W (step S01). In step S01, for example, the control device 100 controls the transfer device A3 so as to transfer the workpiece W of the shelf unit U10 to the liquid processing unit U1 in the processing module 11. Then, the processing control part 122 of the control device 100 controls the liquid processing unit U1 so as to form a coating film AF of a processing liquid for formation of the lower layer film on the front surface Wa of the workpiece W.

In parallel with the step of forming the coating film AF (liquid processing), the processing data acquisition part 124 acquires two types of moving image data from the cameras 112 and 114 of the capturing part 110, respectively, and acquires measurement data from the sensor of the measurement part 90. Thereafter, the processing control part 122 controls the transfer device A3 so as to transfer the workpiece W, on which the coating film AF of the processing liquid for formation of a lower layer film is formed, to the heat treatment unit U2, and controls the heat treatment unit U2 so that the lower layer film is formed on the front surface Wa of the workpiece W. The data recording part 128 associates the date and time at which the execution of the process of forming the lower layer film is completed, the individual information of the liquid processing unit U1 and the heat treatment unit U2, the measurement data, and two types of the moving image data with the individual information of the workpiece W. and then records the associated data in the data storage part 132.

Subsequently, the control device 100 acquires still image data about the front surface Wa of the workpiece W on which the lower layer film is formed (step S02). In step S02, for example, the control device 100 controls the transfer device A3 so as to transfer the workpiece W, on which the lower layer film is formed, to the inspection unit U3 in the processing module 11. Then, the processing data acquisition part 124 acquires still image data of the entire front surface Wa of the workpiece W and still image data of the peripheral edge region (peripheral edge region and end surface) of the front surface Wa from the cameras 72 and 82 of the inspection unit U3.

The data recording part 128 associates two types of still image data with the individual information of the workpiece W and then records the associated data in the data storage part 132. As a result, the two types of still image data and the measurement data obtained in step S01 are also associated with each other. Thereafter, the control device 100 controls the transfer device A3 so as to return the workpiece W, on which the lower layer film is formed, to the shelf unit U10, and controls the transfer device A7 so as to arrange the workpiece W in the cell for the processing module 12.

The measurement data obtained in step S01 is obtained during the period in which the step of forming the coating film AF (the substrate processing of forming the lower layer film) is being executed, and indicates the state of the processing for the workpiece W in the respective step. As described above, the measurement data obtained in step S01 is the data relating to the substrate processing when the moving image data or the still image data is acquired. In the relationship with the moving image data in the above example, the measurement data is obtained in the substrate processing which is being executed when the moving image data is acquired. In the relationship with the still image data, the measurement data is obtained in the substrate processing which has been executed immediately before the still image data is acquired.

Subsequently, the control device 100 controls the coating/developing apparatus 2 so as to execute the substrate processing for forming a resist film on the lower layer film of the workpiece W (step S03). In step S03, for example, the control device 100 controls the transfer device A3 so as to transfer the workpiece W of the shelf unit U10 to the liquid processing unit U1 in the processing module 12. Then, the processing control part 122 controls the liquid processing unit U1 so as to form a coating film AF of a processing liquid for formation of the resist film on the front surface Wa of the workpiece W.

Thereafter, the control device 100 controls the transfer device A3 so as to transfer the workpiece W, on which the coating film AF of the processing liquid for formation of the resist film is formed, to the heat treatment unit U2, and controls the heat treatment unit U2 so that a resist film is formed on the front surface Wa of the workpiece W. Like the data acquisition and recording in step S02, the processing data acquisition part 124 and the data recording part 128 acquire moving image data and measurement data, associate them with the individual information of the workpiece W, and then record the acquired moving image data and the acquired measurement data in the data storage part 132.

Subsequently, the control device 100 acquires still image data about the front surface Wa of the workpiece W on which the resist film is formed (step S04). In step S04, for example, the control device 100 controls the transfer device A3 so as to transfer the workpiece W, on which the resist film is formed, to the inspection unit U3 in the processing module 12. Then, in the same manner as in step S02, the processing data acquisition part 124 and the data recording part 128 acquire still image data of the entire front surface Wa and the peripheral edge region of the workpiece W, associate the still image data with the individual information of the workpiece W, and record the acquired still image data in the data storage part 132. Thereafter, the control device 100 controls the transfer device A3 so as to return the workpiece W, on which the resist film is formed, to the shelf unit U10, and controls the transfer device A7 so as to arrange the workpiece W in the cell for the processing module 12.

Subsequently, the control device 100 controls the coating/developing apparatus 2 so as to execute the substrate processing of forming an upper layer film on the resist film of the workpiece W (step S05). In step S05, for example, the control device 100 controls the transfer device A3 so as to transfer the workpiece W of the shelf unit U10 to the liquid processing unit U1 in the processing module 13. Then, the processing control part 122 controls the liquid processing unit U1 so as to form a coating film AF of a processing liquid for formation of the upper layer film on the front surface Wa of the workpiece W.

Thereafter, the control device 100 controls the transfer device A3 so as to transfer the workpiece W, on which the coating film AF of the processing liquid for formation of the upper layer film is formed, to the heat treatment unit U2, and controls the heat treatment unit U2 so as to form a resist film on the front surface Wa of the workpiece W. Like the data acquisition and recording in step S02, the processing data acquisition part 124 and the data recording part 128 acquire moving image data and measurement data, associate them with the individual information of the workpiece W. and then record the acquired moving image data and the acquired measurement data in the data storage part 132.

Subsequently, the control device 100 acquires still image data about the front surface Wa of the workpiece W on which the upper layer film is formed (step S06). In step S06, for example, the control device 100 controls the transfer device A3 so as to transfer the workpiece W, on which the resist film is formed, to the inspection unit U3 in the processing module 13. Then, in the same manner as in step S02, the processing data acquisition part 124 and the data recording part 128 acquire still image data of the entire front surface Wa and the peripheral edge region of the workpiece W, associate the same with the individual information of the workpiece W. and record the acquired still image data in the data storage part 132. Thereafter, the control device 100 controls the transfer device A3 so that the workpiece W having the upper layer film formed thereon is arranged in any cell of the shelf unit U11.

Subsequently, the control device 100 controls the coating/developing apparatus 2 so as to execute the substrate processing of forming a resist pattern (step S07). In step S07, for example, the control device 100 controls the transfer device A8 so as to transfer the workpiece W of the shelf unit U11 to the exposure apparatus 3 and controls the transfer device A3 to return the exposed workpiece W to the shelf unit U11. Then, the control device 100 controls the transfer device A3 so as to transfer the workpiece W of the shelf unit U11 to the heat treatment unit U2 in the processing module 14, and controls the heat treatment unit U2 so as to perform a pre-development heat treatment on the workpiece W. Thereafter, the control device 100 controls the transfer device A3 so as to transfer the workpiece W subjected to the pre-development heat treatment to the liquid processing unit U1 in the processing module 14, and controls the liquid processing unit U1 so as to perform the developing process on the resist film.

Subsequently, the control device 100 controls the transfer device A3 so as to transfer the developed workpiece W to the heat treatment unit U2 in the processing module 14, and controls the heat treatment unit U2 so as to perform a post-development heat treatment on the workpiece W. Like the data acquisition and recording in step S02, the processing data acquisition part 124 and the data recording part 128 acquire moving image data and the like, associate them with the individual information of the workpiece W, and then record the acquired moving image data and the like in the data storage part 132.

Subsequently, the control device 100 acquires still image data about the front surface Wa of the workpiece W on which the resist film is developed (step S08). In step S08, for example, the control device 100 controls the transfer device A3 so as to transfer the workpiece W, on which the resist film is developed, to the inspection unit U3 in the processing module 14. Then, in the same manner as in step S02, the processing data acquisition part 124 and the data recording part 128 acquire still image data of the entire front surface Wa and the peripheral edge region of the workpiece W, associate the same with the individual information of the workpiece W. and then record the acquired still image data in the data storage part 132. Thereafter, the control device 100 controls the transfer device A3 so as to return the workpiece W to the shelf unit U 10, and controls the transfer device A7 and the transfer device A1 so as to return the workpiece W into the carrier C.

Subsequently, the control device 100 determines whether or not there is an abnormality in each substrate processing in steps S01 S03, S05 and S07 (step S09). In step S09, for example, the abnormality determination part 126 compares the pieces of still image data (still images) before and after forming one layer film (e.g., the resist film) and determines the presence or absence of an abnormality in the substrate processing for formation of the film. Alternatively, the abnormality determination part 126 may determine the presence or absence of an abnormality after calculating the film thickness or the pattern width from the still image data.

The abnormality determination part 126 may determine the presence or absence of an abnormality in the substrate processing based on the moving image data obtained during the execution of the substrate processing. Targets of the abnormality determination based on the moving image data may include the presence or absence of an abnormality when the nozzle 42 is moved between the discharge position and the standby position, the presence or absence of an abnormality when the processing liquid is discharged from the nozzle 42, and the presence or absence of an abnormality when the workpiece W is rotated to form the coating film AF after the discharge is completed. Examples of the target of the abnormality determination when the nozzle 42 is being moved may include determination of whether liquid dripping has occurred in the moving nozzle 42 and determination of whether a droplet has fallen from the moving nozzle 42.

Targets of the abnormality determination when the processing liquid is discharged from the nozzle 42 may include determination of whether the processing liquid discharged from the nozzle 42 is splashed, determination of whether bubbles are generated in the processing liquid in the nozzle 42 under discharge, determination of whether liquid droplets fall from the nozzle 42 immediately after the end of discharge, and determination of whether the arrangement position of the nozzle 42 is appropriate. Examples of the target of abnormality determination during formation (during drying) of the coating film AF may include determination of whether a degree of spread of the coating film is appropriate and determination of whether the progress of drying of the coating film is appropriate. The abnormality determination part 126 may use the above-mentioned two types of moving image data according to the target of abnormality determination.

When it is determined from the still image data that an abnormality is generated in the substrate processing, the abnormality determination part 126 may specify an abnormality generation location. When it is determined from the moving image data that an abnormality is generated in the substrate processing, the abnormality determination part 126 may specify an abnormality generation timing. The data recording part 128 may associate the abnormality determination result obtained by the abnormality determination part 126 with the individual information of the workpiece W and then store the associated data in the data storage part 132. The abnormality determination result may include, in addition to the information indicating the presence or absence of the abnormality, information indicating the abnormality generation location on the front surface Wa and information indicating the abnormality generation timing (the time based on the number of frames on the moving image data or the capturing start time).

In the manner as described above, the coating/developing process for one workpiece W is completed. The control device 100 controls the coating/developing apparatus 2 so as to execute the coating/developing process for each of the subsequent plurality of workpieces W in the same manner as described above. As a result, a plurality of types of substrate processing is executed for each of the plurality of workpieces W, and information on the processing for the plurality of workpieces W is stored (accumulated) in the data storage part 132.

[Display Device]

Next, details of the display device 200 will be described. The display device 200 shown in FIG. 2 is a device that displays, on a display screen, the information relating to processing performed in the coating/developing device 2. The display device 200 is used by a user such as a worker or the like to confirm the state of processing executed previously in the coating/developing device 2. The display device 200 may be used to analyze the cause of a defect of the workpiece W produced in the coating/developing apparatus 2 and may be used to adjust set values of various processing conditions in the substrate processing for the workpiece W.

The display device 200 is a computer that executes a predetermined process for displaying various pieces of information relating to the substrate processing. The display device 200 is configured to execute at least: allowing the display screen to, in response to an instruction from a user, display an image based on first capturing data obtained previously in the coating/developing apparatus 2 with respect to one workpiece W among the plurality of workpieces W already subjected to the above-described coating/developing process; and allowing the display screen to, in response to an instruction from the user, display an image based on second capturing data obtained previously with respect to the one workpiece W in the coating/developing apparatus 2. The display device 200 includes, for example, a main body 202, an input device 204, and a monitor 206. The main body 202 is a main body portion of the computer.

The input device 204 is a device for inputting information (more specifically, input information indicating an instruction from the user) to the main body 202. The input device 204 may be any input device as long as it can input desired information. Specific examples thereof may include a keyboard, an operation panel, a mouse and the like. The monitor 206 is a device for displaying the information output from the main body 202. The monitor 206 may be any monitor as long as it can display information on a screen. Specific examples thereof may include a liquid crystal panel and the like. The input device 204 and the monitor 206 may be integrated as a touch panel. For example, as in a tablet computer, the main body 202, the input device 204 and the monitor 206 may be integrated.

Figure 7:
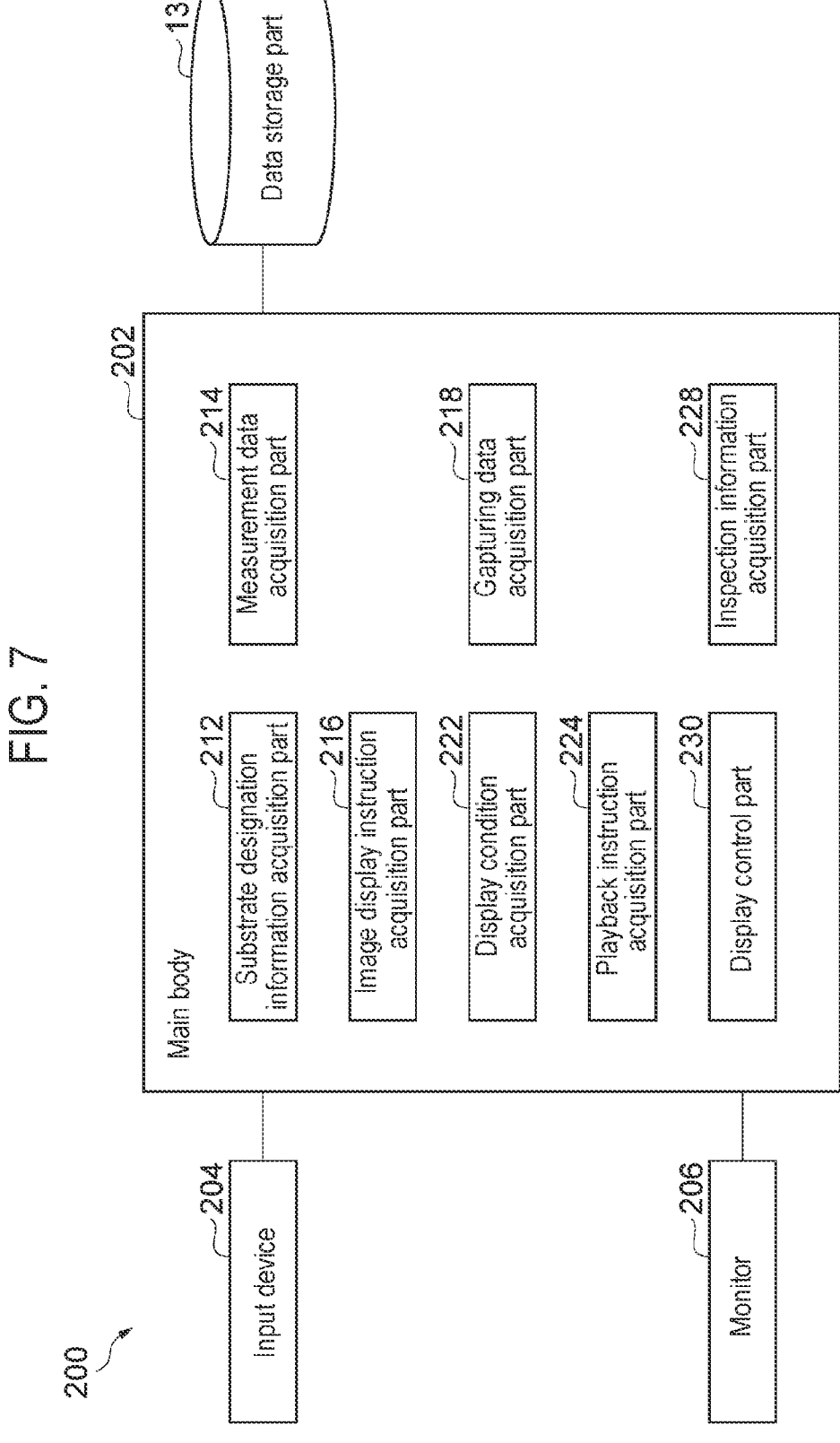
FIG. 7 is a block diagram showing an example of a functional configuration of a display device.

As shown in FIG. 7, the main body 202 of the display device 200 includes, as functional modules, for example, a substrate designation information acquisition part 212, a measurement data acquisition part 214, an image display instruction acquisition part 216, a capturing data acquisition part 218, a display condition acquisition part 222, a playback instruction acquisition part 224, an inspection information acquisition part 228, and a display control part 230. The processing executed by these functional modules corresponds to the processing executed by the main body 202 of the display device 200.

The substrate designation information acquisition part 212 is a functional module that acquires information for specifying the workpiece W designated by the user via the input device 204. The user designates one or more workpieces W to be displayed on the display device 200. In the designation of the plurality of workpieces W, the workpiece W may be specified by the individual information, or the range of the processing date and time may be designated to specify the plurality of workpieces W included in the range. Alternatively, in the designation of the plurality of workpieces W, a project (lot) to be displayed may be designated to specify the plurality of workpieces W included in the project.

The measurement data acquisition part 214 is a functional module that acquires, from the data storage part 132 of the control device 100, the measurement data already obtained by the measurement part 90 (sensor) provided in the coating/developing apparatus 2 during the period in which the substrate processing is executed for the designated workpiece W. The image display instruction acquisition part 216 is a functional module that acquires an image display instruction received from the user via the input device 204 and information specifying the workpiece W selected by the user as an image display target from the plurality of designated workpieces W. Since the user selects the workpiece W whose image is to be displayed from the workpieces W initially designated (e.g., the plurality of workpieces W), the initially-designated workpieces W are candidates of the image display target.

The capturing data acquisition part 218 is a functional module that acquires, from the data storage part 132, the capturing data obtained previously in the coating/developing apparatus 2 with respect to the workpiece W as the image display target (hereinafter referred to as "display target workpiece W"). The display condition acquisition part 222 is a functional module that acquires an instruction regarding an image display condition received from the user via the input device 204. The playback instruction acquisition part 224 is a functional module that acquires a moving image playback start instruction and a moving image playback stop instruction inputted from the user via the input device 204 when a moving image is displayed as the image based on the capturing data. The inspection information acquisition part 228 is a functional module that acquires, from the data storage part 132, the information indicating the presence or absence of an abnormality in the substrate processing for the workpieces W (workpieces W as the candidates of the image display target) initially designated by the user.

The display control part 230 is a functional module that, in response to an instruction inputted from the user via the input device 204, can display, on the display screen of the monitor 206, an image based on one capturing data for the display target workpiece W, and in response to an instruction from the user, can display, on the display screen of the monitor 206, an image based on capturing data different from the one capturing data for the display target workpiece W. Hereinafter, one capturing data will be referred to as "first capturing data," and the capturing data different from the one capturing data will be referred to as "second capturing data." In the present disclosure, the image based on the capturing data indicates either a still image or a moving image.

The first capturing data and the second capturing data for one display target workpiece W are, for example, pieces of data obtained by capturing an image of the one display target workpiece W at different timings in one substrate processing. Specific examples of the timings for obtaining the capturing data may include a timing before the execution of the substrate processing, a timing after the execution of the substrate processing (and before the execution of the next substrate processing), a timing during the execution of any of the steps included in the substrate processing, and a timing after the execution of one step included in the substrate processing and before the execution of another step. In one example, the first capturing data is moving image data obtained by capturing an image of the workpiece W during substrate processing (during execution of any step), and the second capturing data is still image data obtained by capturing an image of the workpiece W after the substrate processing and before the next substrate processing.

The first capturing data and the second capturing data for the display target workpiece W are, for example, pieces of data obtained by capturing images of different capturing regions in one substrate processing. In this case, the capturing for acquiring the first capturing data and the second capturing data may be performed at any timing of the above example. In one example, the first capturing data and the second capturing data are pieces of still image data obtained by capturing images of different capturing regions after one substrate processing and before the next substrate processing. The first capturing data and the second capturing data may be pieces of moving image data obtained by capturing images of different capturing regions during the execution of one substrate processing.

As described above, the first capturing data is data obtained by capturing an image of the workpiece W at a different timing from that of the second capturing data in one substrate processing, or data obtained by capturing an image of a capturing region different from that of the second capturing data in one substrate processing. The first capturing data may be data obtained by capturing an image of a capturing region different from that of the second capturing data at a different timing from that of the second capturing data in one substrate processing. In the present disclosure, the fact that an image based on the first capturing data and an image based on the second capturing data can be displayed on the display screen means that the image based on the first capturing data and the image based on the second capturing data can be displayed on the display screen at different timings (individually) or at the same time.

[Display Method]

Next, with reference to FIGS. 8 to 13, the processing executed in the substrate processing system 1 including the display device 200 will be described as an example of a display method. In this display method, first, the control device 100 stores, in the data storage part 132, the measurement data from the measurement part 90, the capturing data from the capturing part 110, and the capturing data from the inspection unit U3 for the plurality of workpieces W (step S21). The control device 100 repeatedly executes a series of processes shown in FIG. 6, for example, as a process of step S21.

After step S21 is executed, when a processing start instruction is received from the user, the display device 200 starts a display-related processing. In this processing, first, the display device 200 acquires information for specifying a plurality of workpieces W designated by the user (step S22). In step S22, for example, the substrate designation information acquisition part 212 acquires information for specifying the plurality of workpieces W designated by the user based on the information indicating the instruction from the user inputted via the input device 204. When designating a plurality of workpieces W, the user may designate a range of dates and times at which a series of substrate processing is executed by the coating/developing apparatus 2. In this case, a plurality of workpieces W subjected to a series of substrate processing at the date and time in that range will be designated. The user may further designate the type of substrate processing and the individual of the processing unit in order to narrow down the target to be designated.

Subsequently, the display device 200 acquires measurement data for the plurality of workpieces W designated by the user (hereinafter simply referred to as "designated workpiece W") (step S23). In step S23, for example, the measurement data acquisition part 214 requests the data storage part 132 of the control device 100 to transmit the measurement data for each of the designated workpieces W. Upon receiving the request, the data storage part 132 transmits to the measurement data acquisition part 214 the measurement data obtained for each of the designated workpieces W by the measurement part 90 (sensor) provided in the coating/developing apparatus 2 during the period in which the substrate processing is executed for each workpiece W. The measurement data acquisition part 214 acquires measurement data relating to the substrate processing when the type of substrate processing is designated, and acquires measurement data in the processing unit when the individual of the processing unit is designated.

Subsequently, the display device 200 displays, on the display screen 300, information about the measurement data for the designated workpiece W and information for specifying the designated workpiece W (step S24). In step S24, for example, the display control part 230 allows the display screen 300 to display the measurement data obtained by each sensor of the measurement part 90 during the period in which substrate processing (any step) is being executed for each designated workpiece W. In addition, the display control part 230 may allow the display screen 300 to display a list including information for specifying the designated workpiece W.

Figure 9:
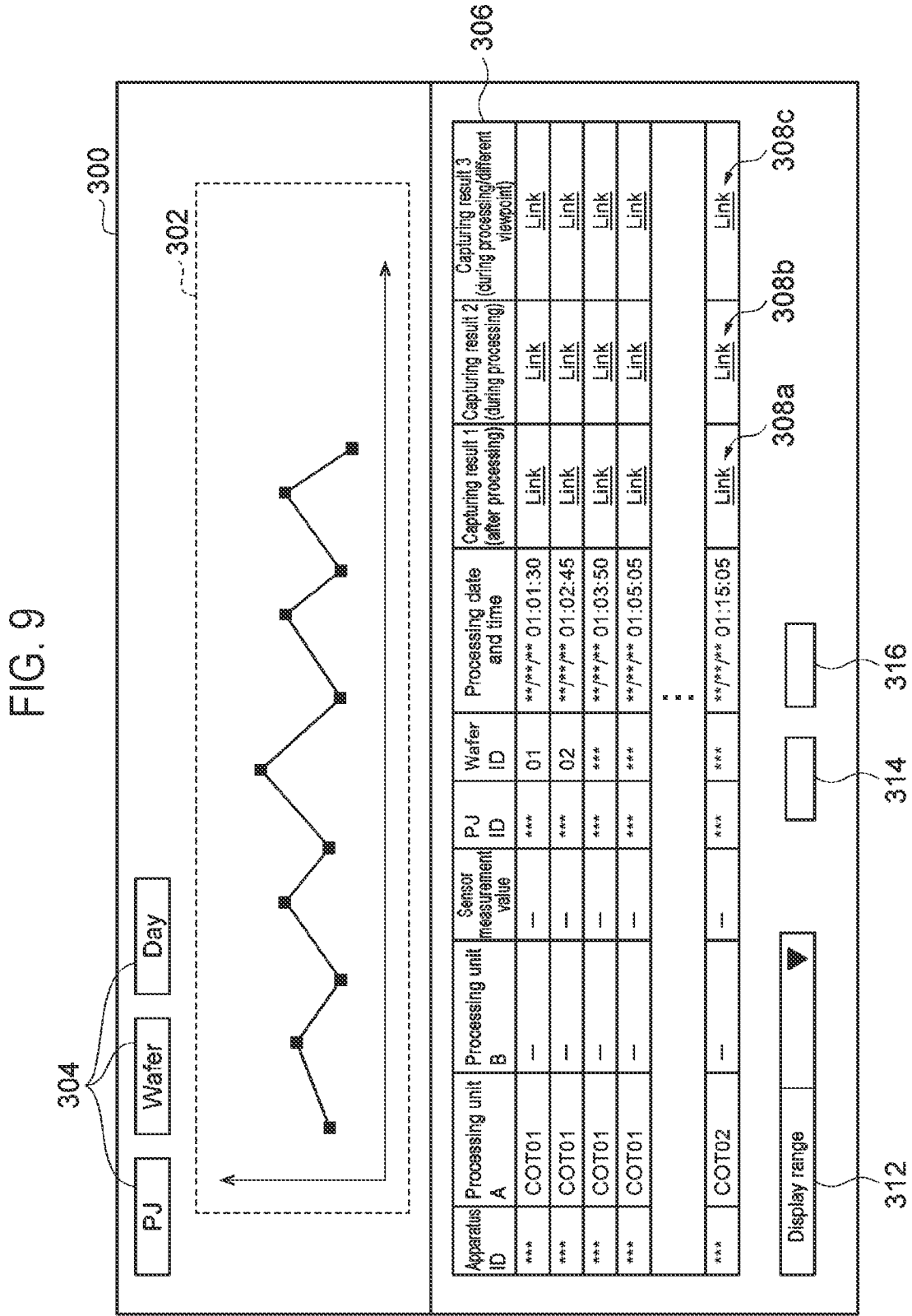
FIG. 9 is a schematic diagram showing an example of display of measurement data and a list image.

FIG. 9 shows an example of displaying the measurement data and the list on the display screen 300. The display control part 230 may allow the display screen 300 to display a graph 302 based on the measurement data. The graph 302 may be a graph that indicates measurement data in a chronological order in one specific substrate processing or one processing unit, or may be a graph that indicates statistical values of measurement data. On the display screen 300, a plurality of selection buttons 304 for selecting a range of measurement data included in the graph 302 may be displayed in the vicinity of the graph 302. The display control part 230 may change the range of measurement data included in the graph 302 in response to a user's operation (e.g., clicking with a mouse) of the selection button 304.

The display control part 230 may display a list 306 on the display screen 300 as information for specifying the designated workpiece W. In the list 306, information regarding one substrate processing for one workpiece W is displayed on each row. In the list 306 shown in FIG. 9, "Apparatus ID" indicates the individual information of the coating/developing apparatus 2 that has executed a series of substrate processing on the designated (displayed) workpiece W. "Processing unit A" and "Processing unit B" indicate the type and name (information indicating an individual) of the processing unit that has executed one substrate processing. For example, the processing unit A corresponds to the liquid processing unit U1, and the processing unit B corresponds to the heat treatment unit U2.

"Sensor measurement value" indicates a measurement value (numerical value) obtained from the sensor of the measuring part 90 provided in the coating/developing apparatus 2. Unlike the display example of FIG. 9, a plurality of columns indicating the measurement values from the plurality of sensors may be provided. The measurement values of the sensors displayed in the list 306 may be included in the measurement data displayed as the graph 302. "PJ ID" indicates information that specifies the project (lot) to which the designated workpiece W belongs. "Wafer ID" indicates individual information for identifying each of the designated workpiece W. "Processing date and time" indicates the date and time at which the substrate processing to be displayed is executed for the workpiece W to be analyzed.

In the list 306, link buttons 308a to 308c for displaying capturing data are indicated on each row (for each workpiece W). The link button 308a located on the column indicated by "Capturing result 1 (after processing)" is a button for receiving an instruction to display the image captured after the substrate processing. The link button 308b located on the column indicated by "Capturing result 2 (during processing)" is a button for receiving an instruction to display the image captured during the substrate processing. The link button 308c located on the column indicated by "Capturing result 2 (during processing) different viewpoint" is a button for receiving an instruction to display the image captured from a viewpoint (capturing region) different from the capturing result 2 during the substrate processing. In the list 306, the user can operate the link buttons 308a to 308c on the row on which the workpiece W whose image is to be displayed is located. That is, the user selects one workpiece W to be displayed (display target workpiece W) from among the plurality of designated workpieces W (workpieces W which may become image display targets).

On the display screen 300, a narrow-down button 312 for further narrowing down the range specified by the user may be displayed in the vicinity of the list 306. The narrow-down button 312 may be a button that can be selected in a pull-down manner. For example, the narrow-down button 312 can further narrow down the project, the type of substrate processing, the individual information of the workpiece W, the processing date and time, and the like in the list 306. When the user operates the narrow-down button 312, the display control part 230 may display the list 306 after further narrowing down the designated range (the plurality of displayed workpieces W). On the display screen 300, the instruction buttons 314 and 316 may be displayed in the vicinity of the list 306. For example, the instruction button 314 is a button for displaying more detailed information on the selected row. The instruction button 316 may be a button for displaying, as a graph 302, the workpiece W and the measurement data in the substrate processing displayed on the selected row.

As shown in FIG. 8, after the execution of step S24, upon receiving an instruction to output the processed image from the user (step S25), the display device 200 acquires the image data according to the instruction (step S26). In step S25, for example, the image display instruction acquisition part 216 receives an image display instruction and acquires information indicating the display target workpiece W in response to the user's operation of any of the link buttons 308a.

In step S26, for example, the capturing data acquisition part 218 acquires still image data obtained by capturing an image of the workpiece W after one substrate processing (the substrate processing to be subjected to image display) for the display target workpiece W. The capturing data acquisition part 218 may request the data storage part 132 to transmit data and may acquire the still image data of the display target workpiece W from the data storage part 132. In one example, for the display target workpiece W, the capturing data acquisition part 218 acquires, from the data storage part 132, still image data (first capturing data) obtained by capturing an image of the entire front surface Wa of the workpiece W on which a predetermined film such as a resist film or the like is formed, and still image data (second capturing data) obtained by capturing an image of the peripheral edge region of the front surface Wa of the workpiece W on which a predetermined film such as a resist film or the like is formed.

Subsequently, the display device 200 displays the two types of still image data acquired in step S26 (step S27). In step S27, for example, the display control part 230 allows the display screen 300 to simultaneously display a still image (hereinafter referred to as a "first still image") based on the still image data obtained by capturing the image of the entire front surface Wa of the display target workpiece W after substrate processing and a still image (hereinafter referred to as a "second still image") based on the still image data obtained by capturing the image of the peripheral edge region of the front surface Wa of the display target workpiece W.

Figure 10:
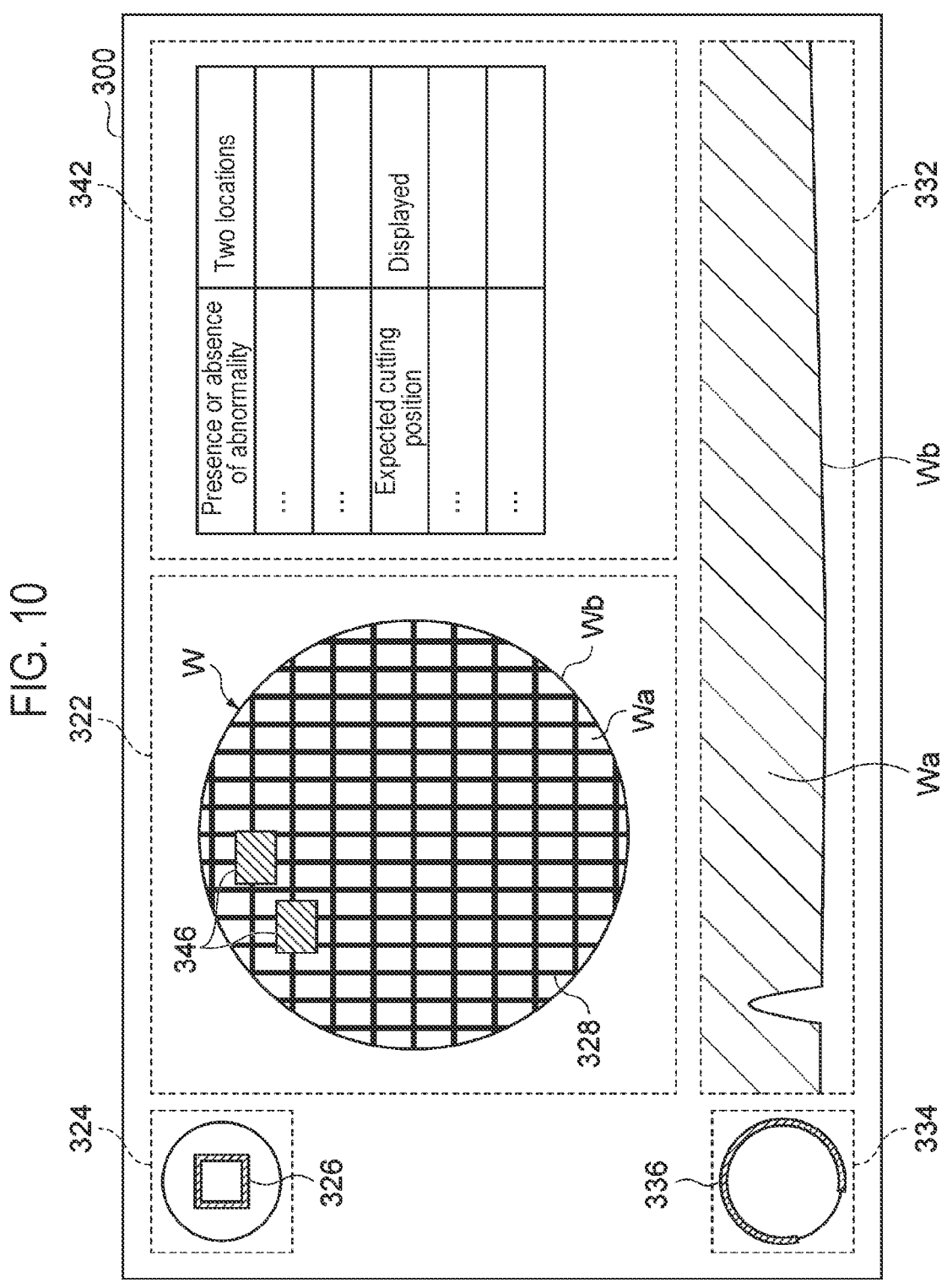
FIG. 10 is a schematic diagram showing an example of display of a processed image.

FIG. 10 shows an example of the first still image and the second still image displayed on the display screen 300. The display control part 230 may display a first still image 322 and a second still image 332 side by side in the vertical direction (vertical direction on the screen) on the display screen 300. Based on the still image data obtained by capturing the image of the peripheral edge region of the front surface Wa of the display target workpiece W, the display control part 230 may cause the display screen 300 to display the second still image 332 having a rectangular shape so that the circumferential position of the workpiece W is indicated on the horizontal axis and the radial position of the workpiece W is indicated on the vertical axis. The horizontal axis corresponds to the horizontal direction on the screen, and the vertical axis corresponds to the vertical direction on the screen. The horizontal axis is orthogonal to the vertical axis.

In the second still image 332, the horizontal position of a pixel corresponds to a circumferential position of the workpiece W (an angle from a circumferential reference position of the workpiece W), and the vertical position of the pixel corresponds to a radial position of the workpiece W. When images obtained by capturing the peripheral edge region of the front surface Wa of the workpiece W and the end surface of the workpiece W are displayed as the second still image 332, a thickness direction position of the workpiece W is indicated on the vertical axis in the region corresponding to the end surface of the workpiece W.

The display control part 230 may allow the display screen 300 to simultaneously display information different from the first still image 322 and the second still image 332. For example, the display control part 230 may allow the display screen 300 to display an auxiliary image 342 including information regarding a processing abnormality and information indicating a still image display method as different pieces of information together with the first still image 322 and the second still image 332. The display control part 230 may allow the display screen 300 to display these images so that the auxiliary image 342 is arranged side by side with respect to the first still image 322 in the horizontal direction. In this case, the first still image 322 and the auxiliary image 342 are displayed on the display screen 300 so as to be adjacent to each other in the horizontal direction on the screen.

The display control part 230 may allow the display screen 300 to display these images so that the second still image 332 is arranged side by side in the vertical direction with respect to both the first still image 322 and the auxiliary image 342. In this case, the first still image 322 (auxiliary image 342) and the second still image 332 are displayed on the display screen 300 so as to be adjacent to each other in the vertical direction on the screen. In the example shown in FIG. 10, the second still image 332 is located below the first still image 322 on the screen. However, the first still image 322 and the second still image 332 may be displayed on the display screen 300 so that the second still image 332 is located above the first still image 322. As shown in FIG. 10, the width of the second still image 332 may be larger than the width of the first still image 322 (auxiliary image 342) or may be approximately the same as the total value of the width of the first still image 322 and the width of the auxiliary image 342.

The display control part 230 may execute control (hereinafter referred to as "enlarged display control") for enlarging and displaying a portion of the first still image 322. The display control part 230 may allow the display screen 300 to display a guide image 324 indicating an enlarged position with respect to the entire first still image 322 at least during a period in which the enlarged display control is executed (during a period overlapping with at least a portion of the execution period of the enlarged display control). For example, the guide image 324 may show a frame 326 corresponding to an outer edge of the displayed portion of the first still image 322. In FIG. 10, the enlarged display of the first still image 322 is not performed, and the display position of the frame 326 does not correspond. In FIG. 10, the position of the frame 326 illustrates a case in which the central portion of the workpiece W is enlarged and displayed in the first still image 322.

Like the first still image 322, the display control part 230 may execute the enlarged display control to enlarge and display a portion of the second still image 332. The display control part 230 may allow the display screen 300 to display a guide image 334 indicating an enlarged position with respect to the entire second still image 332 at least during a period in which the enlarged display control is executed (during a period overlapping with at least a portion of the execution period of the enlarged display control). For example, the guide image 334 may show an arc 336 corresponding to the displayed portion of the second still image 332.

The display control part 230 may superimpose images 346 showing unique regions on the front surface Wa of the display target workpiece W. Examples of the unique regions may include a portion (region) where it is determined that an abnormality has occurred on the front surface Wa of the workpiece W. When such a display is performed, in step S26, the inspection information acquisition part 28 may acquire information indicating the presence or absence of an abnormality in the display target workpiece W and information indicating an abnormality occurrence region from the data storage part 132 of the control device 100.

The display control part 230 may superimpose an image 328 showing an expected cutting position of the display target workpiece W on the first still image 322. More specifically, the image 328 indicates an expected cutting position (line) as a separation line for segmenting the workpiece W after a series of substrate processing is executed in the coating/developing apparatus 2 and a circuit or the like is formed on the front surface Wa of the workpiece W. Information about the cutting position shown by the image 328 is prestored in, for example, the display device 200. Further, the display control part 230 may superimpose the expected cutting position and the unique region on the first still image 322. In this case, the segmented portion that overlaps with the unique region is visualized, whereby the approximate yield (the ratio of the normal segmented portion to the whole) can be easily recognized by a visual image.

As shown in FIG. 8, when the display device 200 receives an instruction to output the in-processing moving image from the user (step S28), the display device 200 acquires the moving image data according to the instruction (step S29). In step S28, for example, the image display instruction acquisition part 216 receives an image display (moving image display) instruction in response to the user's operation of any of the link buttons 308b or any of the link buttons 308c, and acquires information indicating the display target workpiece W.

In step S29, for example, the capturing data acquisition part 218 acquires moving image data obtained by capturing an image of the workpiece W or the surrounding of the workpiece W during one substrate processing (the substrate processing to be displayed as a moving image) for the display target workpiece W. In one example, when the link button 308b is operated, the capturing data acquisition part 218 acquires moving image data (first capturing data) obtained by capturing an image of the above-mentioned capturing region PR1 (see FIG. 4A) during the execution of substrate processing for the display target workpiece W. When the link button 308b is operated, the capturing data acquisition part 218 acquires moving image data (second capturing data) obtained by capturing an image of the above-mentioned capturing region PR2 (see FIG. 4B) during the execution of substrate processing for the display target workpiece W.

Subsequently, the display device 200 displays, on the display screen 300, the moving image based on the moving image data acquired in step S29 (step S30). In step S30, for example, when the link button 308b is operated in step S28, the display control part 230 allows the display screen 30) to display the moving image based on the moving image data obtained by capturing the image of the capturing region PR1. Further, when the link button 308c is operated in step S28, the display control part 230 allows the display screen 300 to display the moving image based on the moving image data obtained by capturing the image of the capturing region PR2. Regardless of which of the link button 308b and the link button 308c is operated, the moving image based on the moving image data may be displayed in the same manner. Hereinafter, an example of a moving image display method when the link button 308b is operated will be described.

The display control part 230 may allow the display screen 300 to display one moving image based on the moving image data about the display target workpiece W. Alternatively, the display control part 230 may allow the display screen 300 to display, in addition to the moving image based on the moving image data about the display target workpiece W, an additional moving image about one workpiece W (hereinafter referred to as "additional display target workpiece W") different from the display target workpiece W. For example, the display control part 230 may simultaneously display a moving image 350a about the display target workpiece W and an additional moving image 350b about the additional display target workpiece W on the display screen 300 in a state in which they are arranged side by side (see FIG. 12). The moving image 350a and the moving image 350b are the same types of moving images.

The display control part 230 may allow the display screen 300 to display the moving images 350a and 350b based on an instruction from the user indicating the arrangement order of the moving image 350a and the additional moving image 350b. The display control part 230 may start the playback of the moving images 350a and 350b at the same time when the user gives an instruction to start the playback. Further, the display control part 230 may stop the playback of the moving images 350*a* and 350*b* at the same time when the user gives an instruction to stop the playback.

Figure 11:
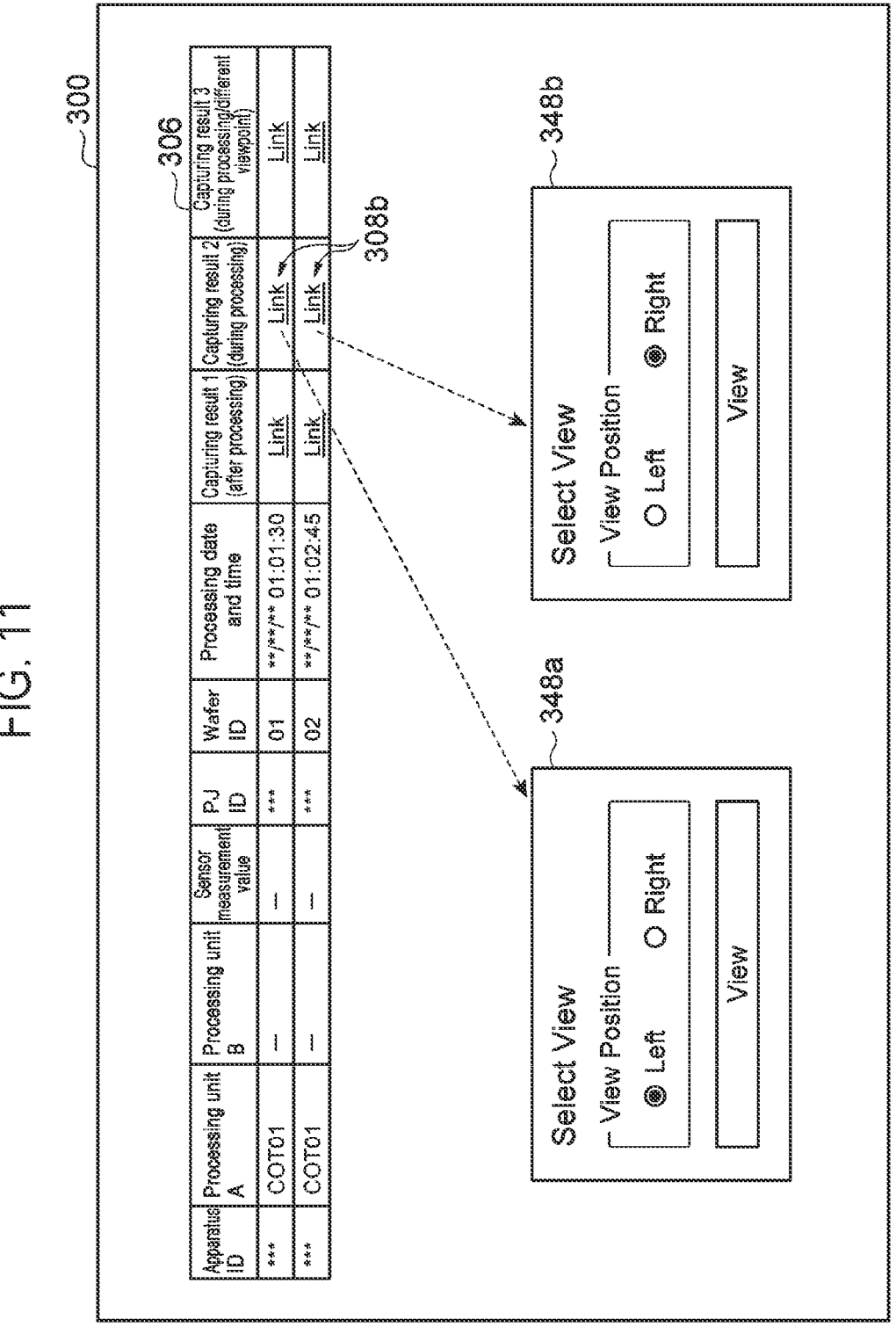
FIG. 11 is a schematic diagram for explaining an example of a process of receiving an output of a moving image during processing.

In one example, as shown in FIG. 11, when the link button 308*b* located on any row is operated by the user, the display control part 230 allows the display screen 300 to display a display position selection screen 348*a*. At this time, the image display instruction acquisition part 216 determines that the specific workpiece W indicated on the respective row is a display target. In one example, the display position selection screen 348*a* displays "Left" and "Right" indicating the left and right positions and includes a selection button for selecting the display position. Then, when the user selects the left or right display position of the moving image 350*a* of the display target workpiece W, the display condition acquisition part 222 acquires information indicating the display position (display condition) of the moving image 350*a*.

When the link button 308*b* located on a row different from the display target workpiece W is operated by the user, the display control part 230 allows the display screen 300 to display a display position selection screen 348*b*. At this time, the image display instruction acquisition part 216 determines that the specific workpiece W shown on another row is another display target. On the display position selection screen 348*b*, the same contents as those of the display position selection screen 348*a* are displayed. Then, when the user selects the left or right display position of the moving image 350*b* of the display target workpiece W, the display condition acquisition part 222 acquires information indicating the display position of the moving image 350*b*. As a result, the display condition acquisition part 222 acquires information indicating the arrangement order of the moving images 350*a* and 350*b*.

Figure 12:
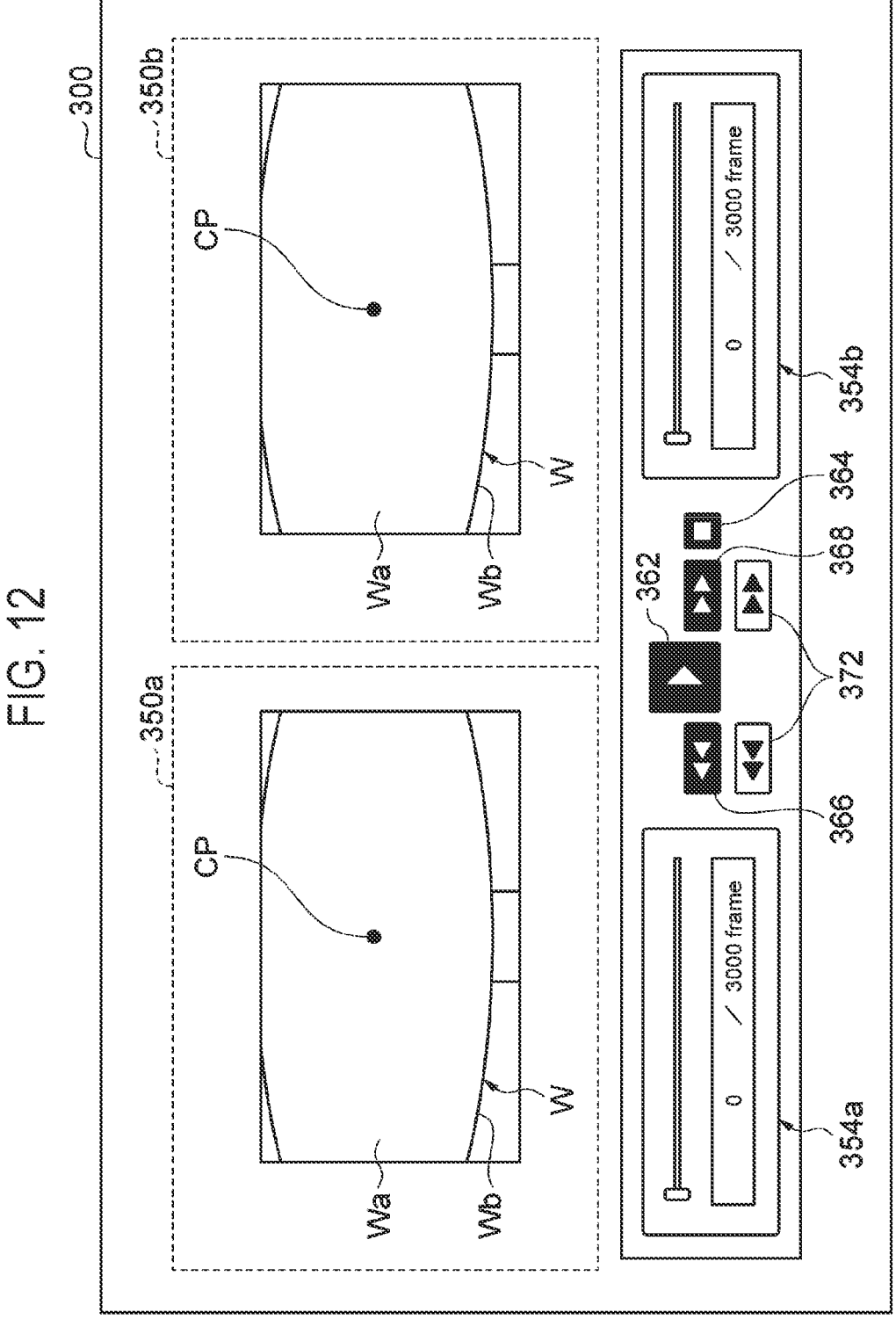
FIG. 12 is a schematic diagram showing an example of display of a moving image during processing.

Thereafter, when the user operates the button "View" included in any of the display position selection screens 348*a* and 348*b*, the display control part 230 shifts to the display for playing back the moving image shown in FIG. 12. For example, the display control part 230 allows the display screen 300 to display the moving image 350*a* and the moving image 350*b* side by side according to the display condition (arrangement order) acquired by the display condition acquisition part 222. The display control part 230 may wait without playing back the moving image until it receives an instruction to play back the moving image.

The display control part 230 may allow the display screen 300 to display, in addition to the moving images 350*a* and 350*b*, various operation buttons for instructing the playback of the moving image and an image indicating the playback state. For example, the display control part 230 may allow the display screen 300 to display a playback button 362 for the user to give an instruction to start the playback of the moving images 350*a* and 350*b*, and a stop button 364 for the user to give an instruction to stop the playback of the moving images 350*a* and 350*b*. The display control part 230 may allow the display screen 300 to display a rewind button 366 for simultaneously rewinding the moving images 350*a* and 350*b*, and a fast-forwarding button 368 for simultaneously fast-forwarding the moving images 350*a* and 350*b*. These operation buttons may be arranged substantially at the center of the range in which the moving images 350*a* and 350*b* are displayed side by side.

When the play button 362 is operated by the user, the playback instruction acquisition part 224 acquires information (hereinafter referred to as "start instruction information") indicating an instruction to start the playback of the moving image. When the stop button 364 is operated by the user, the playback instruction acquisition part 224 acquires information (hereinafter referred to as "stop instruction information") indicating an instruction to stop the playback of the moving image. The display control part 230 simultaneously starts the playback of the moving images 350*a* and 350*b* when the start instruction information is acquired by the playback instruction acquisition part 224. The display control part 230 simultaneously stops the playback of the moving images 350*a* and 350*b* when the stop instruction information is acquired by the playback instruction acquisition part 224.

The display control part 230 may allow the display screen 300 to display, as images showing a playback state, an image 354*a* showing a current playback position of the moving image 350*a* and an image 354*b* showing a current playback position of the moving image 350*b*. For example, in each of the images 354*a* and 354*b*, a numerical value and an indicator indicating the time point of the current playback position in the entire period (total number of frames) of the corresponding moving image are displayed.

The display control part 230 may allow the display screen 300 to display the moving images 350*a* and 350*b* so that execution timings of the substrate processing (e.g., the processing start timings) coincide with each other in the moving images 350*a* and 350*b*. For example, capturing may be performed in the coating/developing apparatus 2 so that the acquisition start timing of the moving image data becomes constant for each substrate processing. Alternatively, information indicating the number of frames corresponding to the processing start timing (information indicating at what frame the substrate processing was started) may be associated with each moving image data and then stored in the data storage part 132.

The display control part 230 may display the moving images 350*a* and 350*b* after enlarging a portion of the capturing region PR1. For example, the display control part 230 may allow the display screen 300 to display the moving images 350*a* and 350*b* based on the moving image data so that the entire front surface Wa of the display target workpiece W is not displayed and a region between the center CP and a portion of the peripheral edge Wb of the front surface Wa of the workpiece W is displayed. A portion of the peripheral edge Wb included in the display screen 300 (e.g., about ½ to ¼ of the entire peripheral edge Wb) may be a portion of the entire circumference of the peripheral edge Wb close to the camera 112. The capturing region of the camera 112 is set in advance so that the entire front surface Wa of the workpiece W is not included in the capturing region and the region between the center CP and a portion of the peripheral edge Wb of the front surface Wa of the workpiece W is included in the capturing region. The display control part 230 may allow the display screen 300 to display only the above region when displaying a moving image for the processing (e.g., discharge of the processing liquid or formation of the coating film AF after discharge) performed while rotating the workpiece W.

After the end of step S30, for example, the display device 200 terminates the processing related to the display in response to an instruction inputted from the user via the input device 204. The above processing is nothing more than an example and may be changed as appropriate. Depending on the instruction from the user, the display device 200 may execute the processing of steps S25 to S27 after executing the processing of steps S28 to S30. Depending on the instruction from the user, the display device 200 may repeatedly execute the processing of steps S28 to S30 or the processing of steps S25 to S27 after changing the display target workpiece W.

In step S24 described above, the display control part 230 allows the display screen 300 to display a list 306 as a list of information that specifies the plurality of workpieces W designated by the user and capable of becoming the display target workpieces W (display target candidates). When inspection information indicating the presence or absence of a processing abnormality in the workpiece W included in the list is held in the display device 200 and an abnormality is indicated by the inspection information, the display control part 230 may allow the list to display that an abnormality has occurred in the substrate processing for the workpiece W whose abnormality is indicated by the inspection information.

In step S24, the display control part 230 may allow the display screen 300 to display a list 306A as shown in FIG. 13 instead of the list 306. In the list 306A, a list of a plurality of workpieces W to be analyzed is indicated as in the list 306. In the list 306, the information for each substrate processing for one workpiece W is indicated, whereas in the list 306A, the information regarding a plurality of substrate processing is collectively displayed for each workpiece W.

In the list 306A, a link button for displaying individual information of the workpiece W and an image for each of the plurality of substrate processing is displayed for each row. The display control part 230 displays the link buttons 352a to 352g for each row. In the example shown in FIG. 13, it is shown that "Process 1," "Process 2," and "Process 3" are different types of substrate processing. Process 1 may be a lower layer film forming process, process 2 may be a resist film forming process, and process 3 may be an upper layer film forming process or a resist film developing process. The link button 352a in the "after completion of process 1" column, the link button 352d in the "after completion of process 2" column, and the link button 352g in the "after completion of process 3" column correspond to the above-described link button 308a for displaying a still image.

The link button 352b in the "Process 2" column and the link button 352e in the "Process 3" column correspond to the above-described link button 308b for displaying the first moving image data. The link button 352c in the "Process 2 (separate range)" column and the link button 352f in the "Process 3 (separate range)" column correspond to the above-described link button 308c for displaying the second moving image data. The user operates the link buttons 352a to 352g according to the substrate processing for which an image is to be displayed, on the row where the workpiece W for which an image is to be displayed is located in the list 306A. The display control part 230 allows the display screen 300 to display an image of the selected substrate processing of the display target workpiece W in response to the operation (instruction).

In step S23, the inspection information acquisition part 228 may acquire information (hereinafter referred to as "inspection information") regarding a processing abnormality for each workpiece W to be analyzed from the data storage part 132 of the control device 100. The inspection information may include information indicating a processing abnormality for each workpiece W. In step S24, when the inspection information for any workpiece W indicates a processing abnormality, the display control part 230 may display, in the list 306A, information indicating that an abnormality has occurred in the substrate processing for the workpiece W.

For example, the display control part 230 may display a mark image 354 in the column (cell) corresponding to the workpiece W and the substrate processing in which processing abnormality is detected. Alternatively, the display control part 230 may make a background color of the column corresponding to the workpiece W and the substrate processing in which the processing abnormality is detected, different from a color of the surrounding in the list 306A. The workpiece W in which the processing abnormality is detected may be selected as the display target workpiece W by the user's operation. The display control part 230 may also display information indicating that an abnormality has occurred in the list 306 shown in FIG. 9.

Information indicating the time (number of frames) at which the processing abnormality is detected may be associated with the moving image data of the workpiece W in which the processing abnormality is detected and may be stored in the data storage part 132. In this case, as shown in FIG. 12, when displaying the moving images 350a and 350b, the display control part 230 may allow the display screen 300 to display a skip button 372 for skipping to the time (frame) at which the processing abnormality is detected.

Figure 14:
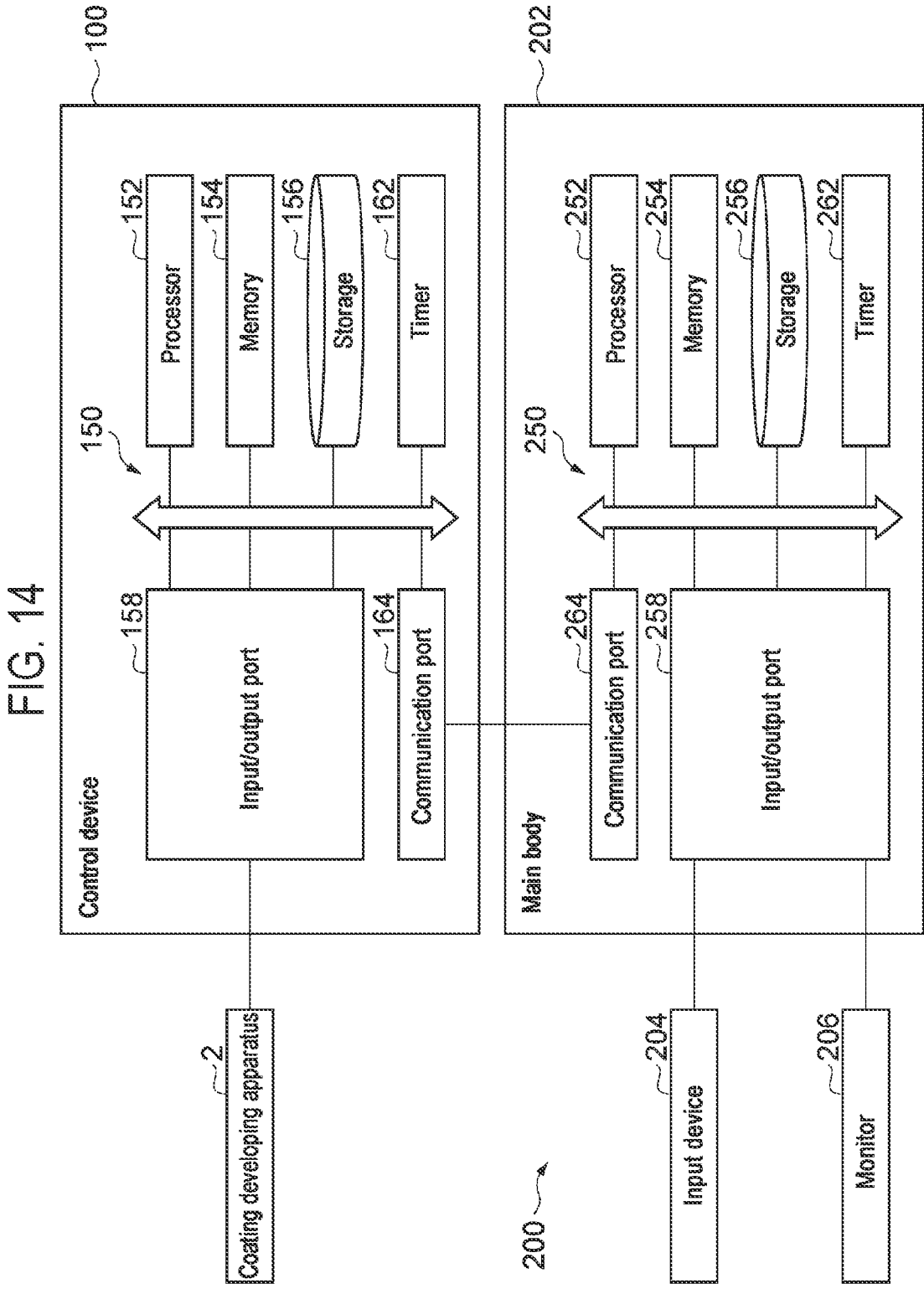
FIG. 14 is a block diagram showing an example of a hardware configuration of the control device and the display device.

FIG. 14 is a block diagram showing an example of a hardware configuration of the control device 100 and the display device 200. The control device 100 is composed of one or more computers. For example, the control device 100 includes a circuit 150. The circuit 150 includes one or more processors 152, a memory 154, a storage 156, an input/output port 158, a timer 162, and a communication port 164. The storage 156 includes a non-transitory computer-readable storage medium such as a hard disk or the like. The storage medium stores a program for causing the control device 100 to execute the substrate processing method. The storage medium may be a removable medium such as a non-volatile semiconductor memory, a magnetic disk, or an optical disk.

The memory 154 temporarily stores the program loaded from the storage medium of the storage 156 and the calculation result obtained by the processor 152. The processor 152 constitutes each functional module of the control device 100 by executing the above program in cooperation with the memory 154. The input/output port 158 inputs and outputs an electric signal with respect to the liquid processing unit U1, the heat treatment unit U2 and the inspection unit U3 of the coating/developing apparatus 2, the measurement part 90, the capturing part 110, and the like in response to a command from the processor 152. The timer 162 measures an elapsed time, for example, by counting a reference pulse having a fixed cycle. The communication port 164 communicates with the display device 200 in a wireless or wired manner, or via a network line, or the like in response to a command from the processor 152.

When the control device 100 is composed of a plurality of computers, each functional module may be implemented by an individual computer. The control device 100 may be composed of a control computer including a functional module for executing various kinds of substrate processing by the coating/developing apparatus 2, and a data server including a functional module (data storage part 132) for storing image data and measurement data. Alternatively, each of these functional modules may be implemented by a combination of two or more computers. In these cases, the plurality of computers may execute the above-described substrate processing method in conjunction with each other while being connected to each other in a communicable relationship with each other.

The display device 200 includes, for example, a circuit 250. The circuit 250 includes one or more processors 252, a memory 254, a storage 256, an input/output port 258, a timer 262, and a communication port 264. The storage 256 includes a non-transitory computer-readable storage medium such as a hard disk or the like. The storage medium stores a program for causing the display device 200 to execute the above-described display method. The storage medium may be a removable medium such as a non-volatile semiconductor memory, a magnetic disk, or an optical disk.

The memory 254 temporarily stores the program loaded from the storage medium of the storage 256 and the calculation result obtained by the processor 252. The processor 252 constitutes each functional module of the display device 200 by executing the above program in cooperation with the memory 254. The input/output port 258 inputs and outputs an electric signal with respect to the input device 204, the monitor 206, and the like in response to a command from the processor 252. The timer 262 measures an elapsed time, for example, by counting a reference pulse having a fixed cycle. The communication port 264 communicates with the control device 100 (the communication port 164) in a wireless or wired manner, or via a network line, or the like in response to a command from the processor 252.

Like the control device 100, the display device 200 may be composed of a plurality of computers. In this case, each functional module may be implemented by an individual computer. Alternatively, each of these functional modules may be implemented by a combination of two or more computers. In these cases, the plurality of display computers may execute the above-described display method in cooperation with each other while being connected to each other in a communicable relationship with each other.

Hardware configurations of the control device 100 and the display device 200 are not necessarily limited to those in which each functional module is configured by a program. For example, each functional module of the control device 100 and the display device 200 may be composed of a dedicated logic circuit or an ASIC (Application Specific Integrated Circuit) in which the logic circuit is integrated.

Effects of the Embodiment

The display device 200 described above is a device for displaying, on the display screen 300, information about the processing executed in the substrate processing apparatus 2 that executes a predetermined substrate processing on a plurality of workpieces W. The display device 200 includes the display control part 230 configured to, in response to an instruction from a user, allow the display screen 300 to display the image based on first capturing data obtained previously by capturing an image of a display target workpiece W among the plurality of workpieces W in the substrate processing apparatus 2, and configured to, in response to an instruction from the user, allow the display screen 300 to display the image based on second capturing data obtained previously by capturing the image of the display target workpiece W in the substrate processing apparatus 2. The first capturing data is data obtained by capturing the image of the display target workpiece W at a different timing from the second capturing data, or data obtained by capturing the image of the display target workpiece W in a different capturing region from the second capturing data.

In this display device 200, the user can confirm two types of images having different imaging timings or different capturing regions from each other for one display target workpiece W. Therefore, it is not necessary to individually confirm the two types of images in different devices, and it is possible to easily understand the state of the substrate processing executed previously for the display target workpiece W.

The display control part 230 may be configured to allow the display screen to display measurement data relating to substrate processing when acquiring the first capturing data or the second capturing data, which is data already obtained for the display target workpiece W and is acquired by the sensor provided in the substrate processing apparatus 2. In this case, the data indicating a measurement value acquired by the sensor and the captured image of the workpiece W for which the data is displayed can be displayed on the display screen. Therefore, the processing result or the processing situation that cannot be confirmed only from the sensor data can be confirmed by one display device without reference to data in another device. Accordingly, it is possible to simplify the work for understanding the state of the substrate processing executed previously.

The first capturing data may be still image data obtained by capturing an image of the entire front surface Wa of the display target workpiece W after the substrate processing. The second capturing data may be still image data obtained by capturing an image of a peripheral edge region of the front surface Wa of the display target workpiece W after the substrate processing. The display control part 230 may be configured to allow the display screen 300 to simultaneously display the first still image 322 based on the first capturing data and the second still image 332 based on the second capturing data. In this case, the user can confirm the processing result of the entire front surface Wa of the workpiece W and the processing result of the peripheral edge region of the front surface Wa of the workpiece W in one display screen 300. As a result, it is possible to shorten the time required to understand the processing result of the entire front surface and the peripheral edge region.

The display control part 230 may be configured to, based on the second capturing data, allow the display screen 300 to display the second still image 332 so that a circumferential direction position of the display target workpiece W is indicated on a horizontal axis and a radial direction position of the display target workpiece W is indicated on a vertical axis. In this case, it is possible to reduce an area for displaying the still image of the peripheral edge region on the display screen 300 compared to a case in which the still image of the peripheral edge region is displayed to conform to the actual shape.

The display control part 230 may be configured to allow the display screen 300 to further display the auxiliary image 342 indicating information different from the first capturing data and the second capturing data so that the auxiliary image 342 is arranged side by side in the horizontal direction with respect to the first still image 322. The display control part 230 may be configured to allow the display screen 300 to display the second still image 332 so that the second still image 332 is arranged side by side in the vertical direction with respect to both the first still image 322 and the auxiliary image 342. In this case, it is possible to effectively utilize a space generated by simultaneously displaying the image of the entire front surface Wa and the image of the peripheral edge region on the display screen 300. For example, in a case in which the image of the peripheral edge region is displayed after being converted into Cartesian coordinates, the image of the peripheral edge region tends to be lengthened in the horizontal direction compared to the image of the entire surface Wa. With this configuration, it is possible to effectively utilize a space generated by a difference in the length in the horizontal direction.

The display control part 230 may be configured to execute the enlarged display control for enlarging and displaying a portion of the first still image 322 or the second still image 332. The display control part 230 may be configured to allow the display screen 300 to display the guide image 324 or 334 indicating an enlarged position with respect to the entirety of the partially enlarged/displayed still image at least during a period in which the enlarged display control is being executed. In this case, the user can easily understand which portion is enlarged with reference to the guide image.

The display control part may be configured to superimpose an image indicating an expected cutting position of the display target workpiece on the first still image. In this case, it is possible to estimate the influence of the result of the substrate processing on each chip obtained by cutting and segmenting the workpiece W. For example, when the abnormality occurrence location is displayed over the first still image, it is possible to predict the yield in one workpiece W.

The first capturing data may be moving image data obtained by capturing an image of the display target workpiece W or the surrounding of the display target workpiece W during execution of the substrate processing on the display target workpiece W. The second capturing data may be still image data obtained by capturing an image of at least a portion of the front surface Wa of the display target workpiece W after the substrate processing. In this case, in one display device, the processing situation can be confirmed by a moving image and the processing result can be confirmed by a still image for one substrate. As a result, it becomes easier to understand the processing state. For example, when an abnormal location is found in a still image, the cause of the abnormality can be specified by checking the moving image of the workpiece W.

The first capturing data may be moving image data obtained by capturing an image of the display target workpiece W or the surrounding of the display target workpiece W during execution of the substrate processing on the display target workpiece W. The display control part 230 may be configured to simultaneously display side by side, on the display screen, the moving image 350a based on the moving image data and the additional moving image 350b corresponding to the moving image on a workpiece W different from the display target workpiece W. In this case, it is possible to confirm the processing situation while comparing two different workpieces W. For example, by comparing and checking the moving images, it is possible to easily find an abnormality in the processing of one workpiece W.

The display control part 230 may be configured to allow the display screen 300 to display the moving image 350a and the additional moving image 350b based on an instruction from the user indicating the arrangement order of the moving image 350a and the additional moving image 350b. In this case, the user can confirm the moving image by understanding the correspondence between the two moving images and the individual workpiece W.

The display control part 230 may be configured to, upon receiving a playback start instruction from the user, start playback of the moving image 350a and playback of the additional moving image 350b at the same time. The display control part 230 may be configured to, upon receiving a playback stop instruction from the user, stop the playback of the moving image 350a and the playback of the additional moving image 350b at the same time. In this case, it is possible to simplify the user's instruction (e.g., the operation using the input device 204) when comparing and confirming the two moving images.

The display control part 230 may be configured to allow the display screen 300 to display the moving image 350a and the additional moving image 350b so that the execution timings of the substrate processing in the displayed moving images coincide with each other. In this case, it becomes easy to understand the processing situation by comparing the moving images.

The display control part 230 may be configured to allow the display screen 300 to display the moving images 350a and 350b based on the moving image data so that the entire front surface Wa of the display target workpiece W is not displayed and a region between the center and a portion of the peripheral edge Wb of the front surface Wa of the display target workpiece W is displayed. In this case, it is possible to confirm the state of the front surface Wa of the workpiece W in the moving images at high resolution. For example, when the workpiece W is rotating in the substrate processing, it is possible to confirm the processing situation on the entire front surface Wa of the workpiece W at high resolution.

The display control part 230 may be configured to allow the display screen 300 to display a list of information specifying a plurality of workpieces W designated by the user and capable of becoming the display target workpieces W. The display control part 230 may be configured to allow the display device 200 to hold inspection information indicating the presence or absence of a processing abnormality for the workpieces W included in the list and may be configured to, when the inspection information indicates an abnormality, allow the list to display information indicating that an abnormality has occurred in the substrate processing for the workpiece W for which the abnormality is indicated by the inspection information. In this case, the user can immediately understand the workpiece W on which the abnormality has occurred by checking the list. As a result, it is possible to understand which workpiece W has an abnormality using the display device 200. This makes it possible to simplify the work of understanding the state of the substrate processing for the workpiece W in which the abnormality has occurred.

[Modifications]

In the above-described embodiments, as the combinations of the first capturing data and the second capturing data, there are illustrated the pieces of still image data having different capturing regions after the substrate processing and the pieces of moving image data having different capturing regions during the substrate processing. Further, as the combinations of the first capturing data and the second capturing data, there are illustrated the pieces of still image data and the pieces of moving image data having different imaging timings in one substrate processing. The combination of the first capturing data and the second capturing data is not limited to these examples. The first capturing data may be still image data obtained by capturing an image of the workpiece W during the substrate processing (during execution of any step), and the second capturing data may be either still image data or moving image data obtained by capturing an image of the workpiece W after the substrate processing (after execution of all steps in the substrate processing).

The first capturing data may be still image data obtained by capturing an image of the workpiece W during the substrate processing, and the second capturing data may be still image data obtained by capturing an image of the workpiece W in a different capturing region from that of the first capturing data during the substrate processing. The second capturing data may be one of still image data and moving image data obtained by capturing an image of the workpiece W for different substrate processing from the substrate processing in which the first capturing data was obtained (e.g., during the substrate processing or after the substrate processing). When the first capturing data and the second capturing data are obtained in different substrate processing, the image types and the capturing regions may be the same or different from each other.

In the above-described embodiments, the process of forming a film and the process of performing a predetermined process on the film have been described as examples of the substrate processing. However, the examples of the substrate processing are not limited thereto. Other examples of the substrate processing may include cleaning the workpiece W, locally exposing the workpiece W, adjusting the temperature of the workpiece W, irradiating the workpiece W with light, and removing a portion or the entirety of the film on the workpiece W. Further, the step (unit processing) executed for each unit may correspond to one substrate processing. For example, each of the step of performing the liquid processing in the liquid processing unit U1 (the step of forming the coating film or the step of developing) and the step of performing the heat treatment in the heat treatment unit U2 may correspond to one substrate processing.

In the above examples, the control device 100, which is a device provided outside the display device 200, stores the measurement data and the capturing data. However, the display device may include a data storage part for storing the measurement data and the capturing data. In this case, the capturing data acquisition part 218 or the like may acquire various pieces of data from the data storage part of the display device.

In the substrate processing system 1, one display device 200 may be provided for one coating/developing apparatus 2, and one display device 200 may be provided for a plurality of coating/developing apparatuses 2. Places (rooms or buildings) where the coating/developing apparatus 2, the control device 100, and the display device 200 are provided may be the same or may be different from each other.

According to the present disclosure in some embodiments, it is possible to provide a display device, a display method, and a non-transitory computer-readable storage medium capable of easily understanding a state of substrate processing executed previously.

Various embodiments of the present disclosure are described herein for purposes of explanation and may be modified without departing from the scope and gist of the present disclosure. Therefore, the various embodiments disclosed herein are not intended to be limiting, and the true scope and gist are indicated by the appended claims.

What is claimed is:

1. A display device for displaying, on a display screen, information about a predetermined substrate processing executed in a substrate processing apparatus that includes processing units including a liquid processing unit, a heat treatment unit, and an inspection unit to execute the predetermined substrate processing on a plurality of substrates, the display device comprising:

a display control part configured to, in response to a first instruction from a user, allow the display screen to display a first image based on first capturing data obtained previously by capturing an image of a display target substrate among the plurality of substrates in the processing units, and configured to, in response to a second instruction from the user, allow the display screen to display a second image based on second capturing data obtained previously by capturing an image of the display target substrate in the processing units, wherein the first capturing data is data obtained by capturing the image of the display target substrate at a different timing from the second capturing data, or data obtained by capturing the image of the display target substrate in a different capturing region from the second capturing data, wherein the first capturing data is still image data obtained by capturing an image of an entirety of a front surface of the display target substrate after the predetermined substrate processing, wherein the second capturing data is still image data obtained by capturing an image of a peripheral edge region of the front surface of the display target substrate after the predetermined substrate processing, wherein the display control part is configured to allow the display screen to simultaneously display a first still image based on the first capturing data and a second still image based on the second capturing data, wherein the display control part is configured to, based on the second capturing data, allow the display screen to display the second still image so that a circumferential direction position of the display target substrate is indicated on a horizontal axis and a radial direction position of the display target substrate is indicated on a vertical axis, and wherein the display control part is configured to superimpose an image indicating an expected cutting position of the display target substrate on the first still image.

2. The display device of claim 1, wherein the display control part is configured to allow the display screen to display measurement data relating to the predetermined substrate processing when the first capturing data or the second capturing data, which is data already obtained for the display target substrate, is acquired by a sensor provided in the processing units.

3. The display device of claim 1, wherein the display control part is configured to allow the display screen to further display an auxiliary image indicating information different from the first capturing data and the second capturing data so that the auxiliary image is arranged side by side in the horizontal direction with respect to the first still image, and the display control part is configured to allow the display screen to display the second still image so that the second still image is arranged side by side in the vertical direction with respect to both the first still image and the auxiliary image.

4. The display device of claim 1, wherein the display control part is configured to execute an enlarged display control for enlarging and displaying a portion of the first still image or the second still image, and the display control part is configured to allow the display screen to display a guide image indicating an enlarged position with respect to an entirety of a partially enlarged/displayed still image at least during a period in which the enlarged display control is being executed.

5. The display device of claim 1, wherein the display control part is configured to allow the display screen to display a list of information specifying a plurality of candidate substrates designated by the user and capable of becoming the display target substrate, and the display control part is configured to allow the display device to hold inspection information indicating a presence or absence of a processing abnormality for the plurality of candidate substrates included in the list and configured to, when the inspection information indicates an abnormality, allow the list to display information indicating that an abnormality has occurred in the predetermined substrate processing for the candidate substrate for which the abnormality is indicated by the inspection information.

6. A method of displaying, on a display screen, information about a predetermined substrate processing executed in a substrate processing apparatus that includes processing units including a liquid processing unit, a heat treatment unit, and an inspection unit to execute the predetermined substrate processing on a plurality of substrates, the method comprising:

allowing the display screen to, in response to a first instruction from a user, display a first image based on first capturing data obtained previously by capturing an image of a display target substrate among the plurality of substrates in the processing units; and allowing the display screen to, in response to a second instruction from the user, display a second image based on second capturing data obtained previously by capturing the image of the display target substrate in the processing units, wherein the first capturing data is data obtained by capturing the image of the display target substrate at a different timing from the second capturing data, or data obtained by capturing the image of the display target substrate in a different capturing region from the second capturing data, wherein the first capturing data is still image data obtained by capturing an image of an entirety of a front surface of the display target substrate after the predetermined substrate processing, wherein the second capturing data is still image data obtained by capturing an image of a peripheral edge region of the front surface of the display target substrate after the predetermined substrate processing, wherein the display control part is configured to allow the display screen to simultaneously display a first still image based on the first capturing data and a second still image based on the second capturing data, wherein the display control part is configured to, based on the second capturing data, allow the display screen to display the second still image so that a circumferential direction position of the display target substrate is indicated on a horizontal axis and a radial direction position of the display target substrate is indicated on a vertical axis, and wherein the display control part is configured to superimpose an image indicating an expected cutting position of the display target substrate on the first still image.

7. A non-transitory computer-readable storage medium that stores a program for causing a device to execute the display method of claim 6.

8. The display device of claim 1, wherein the first image based on the first capturing data and the second image based on the second capturing data have different visibility ranges from each other.

9. The display device of claim 1, wherein the first image based on the first capturing data and the second image based on the second capturing data are displayed with different coordinate systems.

* * * * *